United States Patent
Xu et al.

(10) Patent No.: US 12,482,676 B2
(45) Date of Patent: Nov. 25, 2025

(54) RESEARCH WET ETCHING FULLY AUTOMATIC SYSTEM AND MACHINE

(71) Applicant: THE HONG KONG UNIVERSITY OF SCIENCE AND TECHNOLOGY (GUANGZHOU), Guangdong (CN)

(72) Inventors: Wei Xu, Guangdong (CN); Yijie Li, Guangdong (CN); Xiangjun Zeng, Guangdong (CN); Ji Li, Guangdong (CN); Nina Wang, Guangdong (CN); Xuemeng Feng, Guangdong (CN)

(73) Assignee: THE HONG KONG UNIVERSITY OF SCIENCE AND TECHNOLOGY (GUANGZHOU), Guangzhou (CN)

( * ) Notice: Subject to any disclaimer, the term of this patent is extended or adjusted under 35 U.S.C. 154(b) by 0 days.

(21) Appl. No.: 19/082,602

(22) Filed: Mar. 18, 2025

(65) Prior Publication Data
US 2025/0323067 A1    Oct. 16, 2025

(51) Int. Cl.
*H01L 21/67* (2006.01)
*B25J 9/16* (2006.01)
(Continued)

(52) U.S. Cl.
CPC ........ *H01L 21/6708* (2013.01); *B25J 9/1697* (2013.01); *B25J 11/0095* (2013.01);
(Continued)

(58) Field of Classification Search
None
See application file for complete search history.

(56) References Cited

U.S. PATENT DOCUMENTS

| | | | | |
|---|---|---|---|---|
| 6,514,355 | B1 * | 2/2003 | Betancourt | H01L 21/67086 134/2 |
| 7,039,499 | B1 * | 5/2006 | Nasr | B25J 9/046 414/217 |

(Continued)

FOREIGN PATENT DOCUMENTS

| | | |
|---|---|---|
| CN | 105225981 A | 1/2016 |
| CN | 108470693 A | 8/2018 |

(Continued)

OTHER PUBLICATIONS

First Office Action with Search Report for CN 202410452002.8, dated May 22, 2024, 17 pages.
(Continued)

*Primary Examiner* — Sylvia MacArthur
(74) *Attorney, Agent, or Firm* — Quarles & Brady LLP

(57) ABSTRACT

A research wet etching fully automatic system includes: a machine system for providing a miniaturized machine chamber; an etching system including chemical solution modules in the miniaturized machine chamber, the chemical solution module including a chemical solution tank and a chemical solution supply mechanism for supplying a chemical solution to the chemical solution tank according to a preset chemical solution supply strategy and controlling an etching environment in the chemical solution tank; a feeding system for implementing automatic transportation of a workpiece; a robot system including a robot module and a vision module communicatively connected thereto; and a control system. The robot module is internally arranged at a top of the working space, and is configured for gripping the workpiece according to image information fed back by the vision module, and placing the workpiece into the chemical solution tank for etching according to a preset etching strategy.

27 Claims, 14 Drawing Sheets

(51) Int. Cl.
  *B25J 11/00* (2006.01)
  *H01L 21/673* (2006.01)
  *H01L 21/677* (2006.01)
  *H01L 21/687* (2006.01)

(52) U.S. Cl.
  CPC .. *H01L 21/67051* (2013.01); *H01L 21/67253* (2013.01); *H01L 21/6773* (2013.01); *H01L 21/68707* (2013.01)

(56) References Cited

U.S. PATENT DOCUMENTS

| | | | | |
|---|---|---|---|---|
| 11,862,474 | B2* | 1/2024 | Inoue | H01L 21/32134 |
| 2003/0164179 | A1* | 9/2003 | Kamikawa | H01L 21/67781 |
| | | | | 134/25.4 |
| 2008/0242103 | A1* | 10/2008 | Ohmuro | H01L 21/67086 |
| | | | | 257/E21.221 |
| 2021/0391188 | A1 | 12/2021 | Inoue et al. | |

FOREIGN PATENT DOCUMENTS

| | | | |
|---|---|---|---|
| CN | 109935543 A | 6/2019 | |
| CN | 214313143 U | 9/2021 | |
| CN | 115206833 A * | 10/2022 | ........ H01L 21/31111 |
| JP | 2007-294606 A | 11/2007 | |
| JP | 2022158331 A | 10/2022 | |
| KR | 20060075086 A | 7/2006 | |
| KR | 101095192 B1 | 12/2011 | |
| WO | 2014027516 A1 | 2/2014 | |
| WO | 2014027517 A1 | 2/2014 | |
| WO | 2016088798 A1 | 6/2016 | |
| WO | 2023162464 A1 | 8/2023 | |

OTHER PUBLICATIONS

Supplementary Search Report for CN 202410452002.8, dated Jun. 6, 2024, 2 pages.
First Office Action for JP Application No. 2025-043570, mailed May 26, 2025, 6 pages.

* cited by examiner

RESEARCH WET ETCHING FULLY AUTOMATIC SYSTEM AND MACHINE

CROSS-REFERENCE TO RELATED APPLICATION

This application is based on and claims the benefit of priority from Chinese Patent Application No. 202410452002.8, filed on 16 Apr. 2024, the entirety of which is incorporated by reference herein.

TECHNICAL FIELD

The present disclosure relates to the technical field of semiconductor cleaning and etching, and in particular, to a research organic wet-processing equipment.

BACKGROUND

In the manufacturing process of semiconductor micro-nano devices, a wet-processing equipment is required for cleaning and acid-base etching of wafer surfaces. However, in the field of scientific research, there is currently no fully automatic wet-processing equipment which can be used for scientific research. Although conventional enterprise-level wet-processing equipment is highly automatic, it is only suitable for mass production and have the following problems:

1. The equipment has a large size which will occupy the space of the clean room of scientific research sites, causing a waste of resources.
2. The centralized supply of the chemical solution and the design of a large chemical solution tank consume a large amount of chemical solutions, greatly increasing scientific research costs.
3. The conventional enterprise-level wet-processing equipment is only applicable to large-size semiconductors (4/6/8/12-inch wafers), and is not compatible with small-size semiconductors (1 cm to 2 cm wafers).
4. The conventional enterprise-level wet-processing equipment is designed according to the standard process flow of industrial production, which cannot meet the flexible scientific research scenarios.

At present, the research on semiconductors in colleges and universities mainly relies on manual operation, and chemical solution reagents are manually fetched and formulated. Since the wet etching process involves a variety of dangerous chemical solution reagents, improper protection or non-standardized operation is likely to cause danger, endangering the lives, health, and safety of researchers. In addition, most experimental scenarios require manual operation of small equipment, which is inconvenient to operate, and results in disadvantages of unstable process and low efficiency.

To sum up, no research has been conducted on how to improve the scientific research efficiency and the process stability, and the development of the research on semiconductors is seriously restricted. Therefore, there is an urgent need to provide a solution to the above problems.

SUMMARY

In view of the above, an objective of embodiments of the present disclosure is to provide a research wet etching fully automatic system and machine, which can meet the scientific research needs of colleges and universities and improve the scientific research efficiency and the process stability.

To achieve the above objective, an embodiment of the present disclosure provides a research wet etching fully automatic system, including a machine system, an etching system, a feeding system, a robot system, and a control system, where:

the machine system is configured for providing a miniaturized machine chamber including an installation space and a working space;

the etching system includes a plurality of chemical solution modules arranged in an arc pattern in the miniaturized machine chamber;

each of the chemical solution modules includes a chemical solution tank and a chemical solution supply mechanism;

the chemical solution supply mechanism is configured for supplying a chemical solution to the chemical solution tank according to a preset chemical solution supply strategy and controlling an etching environment in the chemical solution tank;

the feeding system is configured for conveying a workpiece into the working space and closing the working space after the conveying is completed;

the robot system includes a robot module and a vision module communicatively connected to the robot module;

the robot module is internally arranged at a top of the working space, and is configured for gripping the workpiece according to image information fed back by the vision module, and placing the workpiece into the chemical solution tank for etching according to a preset etching strategy;

the control system is communicatively connected to the machine system, the feeding system, the robot system, and the etching system, and is configured for implementing automatic etching operation according to a user instruction;

In an embodiment, the robot module is further configured for gripping a cleaning tool according to the image information fed back by the vision module to execute a cleaning action.

In an embodiment, the robot module is further configured for executing at least one of a telescoping operation, a rotation operation, and a shaking operation.

In an embodiment, the research wet etching fully automatic system further includes a timing system, where:

the timing system is configured for acquiring running time information of the machine system, the feeding system, and the robot system and feeding back the running time information to the control system, such that the control system controls the machine system, the feeding system, the robot system, and the etching system according to a preset time strategy.

In an embodiment, the research wet etching fully automatic system further includes a human-computer interaction system and a monitoring system, where:

the human-computer interaction system is communicatively connected to the control system;

the monitoring system is configured for respectively acquiring running data of the machine system, the robot system, the etching system, and the feeding system, and sending out an alarm when the running data exceeds a threshold; and the monitoring system is further configured for monitoring the machine system, the robot system, the etching system, and the feeding system in real time according to a preset monitoring strategy.

In an embodiment, the chemical solution supply mechanism includes a chemical solution supply module and an etching environment module;

the chemical solution supply module is configured for supplying a chemical solution in a small-capacity chemical solution tank to the chemical solution tank;

the etching environment module includes at least one of a heating module, a bubbling module, an ultrasonic vibration module, a cleaning module, a spray module, and a circulation filtration module; and the chemical solution tank is provided with an overflow recovery module.

The present disclosure further discloses a research wet etching fully automatic machine, including a machine body and a research wet etching fully automatic system, where:

the research wet etching fully automatic system is arranged on the machine body and includes a machine system, an etching system, a feeding system, a robot system, and a control system;

the machine system is configured for providing a miniaturized machine chamber including an installation space and a working space;

the etching system includes a plurality of chemical solution modules arranged in an arc pattern in the miniaturized machine chamber;

each of the chemical solution modules includes a chemical solution tank and a chemical solution supply mechanism;

the chemical solution supply mechanism is configured for supplying a chemical solution to the chemical solution tank according to a preset chemical solution supply strategy and controlling an etching environment in the chemical solution tank;

the feeding system is configured for conveying a workpiece into the working space and closing the working space after the conveying is completed;

the robot system includes a robot module and a vision module communicatively connected to the robot module;

the robot module is internally arranged at a top of the working space, and is configured for gripping the workpiece according to image information fed back by the vision module, and placing the workpiece into the chemical solution tank for etching according to a preset etching strategy; and the control system is communicatively connected to the machine system, the feeding system, the robot system, and the etching system, and is configured for implementing automatic etching operation according to a user instruction.

In an embodiment, the robot module is further configured for gripping a cleaning tool according to the image information fed back by the vision module to execute a cleaning action.

In an embodiment, the robot module is further configured for executing at least one of a telescoping operation, a rotation operation, and a shaking operation.

In an embodiment, the research wet etching fully automatic system further includes a timing system, where:

the timing system is configured for acquiring running time information of the machine system, the feeding system, and the robot system and feeding back the running time information to the control system, such that the control system controls the machine system, the feeding system, the robot system, and the etching system according to a preset time strategy.

In an embodiment, the research wet etching fully automatic system further includes a human-computer interaction system and a monitoring system, where:

the human-computer interaction system is communicatively connected to the control system;

the monitoring system is configured for respectively acquiring running data of the machine system, the robot system, the etching system, and the feeding system, and sending out an alarm when the running data exceeds a threshold; and the monitoring system is further configured for monitoring the machine system, the robot system, the etching system, and the feeding system in real time according to a preset monitoring strategy.

In an embodiment, the chemical solution supply mechanism includes a chemical solution supply module and an etching environment module;

the chemical solution supply module is configured for supplying a chemical solution in a small-capacity chemical solution tank to the chemical solution tank;

the etching environment module includes at least one of a heating module, a bubbling module, an ultrasonic vibration module, a cleaning module, a spray module, and a circulation filtration module; and the chemical solution tank is provided with an overflow recovery module.

In an embodiment, the robot module is a collaborative robot.

In an embodiment, the miniaturized machine chamber is arranged in the machine body;

a supporting partition plate is arranged in the miniaturized machine chamber;

the miniaturized machine chamber is divided into an upper chamber and a lower chamber by the supporting partition plate; and the working space is formed in the upper chamber.

In an embodiment, the plurality of chemical solution modules are circumferentially arranged in the lower chamber; and the supporting partition plate is provided with first avoidance ports respectively in communication with the chemical solution tanks in the chemical solution modules.

In an embodiment, an electric control chamber and a chemical solution stock chamber configured for storing the small-capacity chemical solution tank are provided in a space below the miniaturized machine chamber in the machine body.

In an embodiment, the machine system further includes a fan filter unit;

the machine body is provided with an air exhaust port and an air supply port in communication with the upper chamber; and the fan filter unit is mounted on the machine body and connected to the air supply port.

In an embodiment, a spray cleaning device is further mounted on the machine body;

the spray cleaning device includes a spray assembly and a movable device;

the movable device is mounted in the upper chamber and connected to the spray assembly, and is configured for driving the spray assembly to move;

a plurality of first drainage holes are provided in the supporting partition plate; and the lower chamber is provided with a main drainage pipe in communication with the outside of the machine body.

In an embodiment, a water collecting portion is provided at a middle part of the supporting partition plate; and
   a second drainage hole is provided in the water collecting portion.

In an embodiment, a support cylinder connected to the supporting partition plate is provided in a middle part of the lower chamber;
   a distribution control chamber is provided in the support cylinder;
   the second drainage hole is in communication with the distribution control chamber;
   a branch drainage pipe connected to the second drainage hole is arranged in the distribution control chamber; and
   an end of the branch drainage pipe away from the second drainage hole extends out of the support cylinder.

In an embodiment, the research wet etching fully automatic system further includes a cassette for holding the workpiece; and
   a cassette clamping mechanism configured for gripping the cassette is connected at an end of the robot module.

In an embodiment, the cassette clamping mechanism includes a clamping driving assembly and two clamping members;
   the clamping driving assembly is connected to the two clamping members and is configured for driving the two clamping members to open and close to grip the cassette; and
   an explosion-proof and anti-corrosion protective cover is sleeved over the clamping driving assembly.

In an embodiment, the cassette includes two fixing plates;
   the two fixing plates are arranged in parallel and spaced apart, and are fixedly connected to each other by a plurality of connecting rods;
   an accommodating cavity for accommodating the workpiece is defined by the connecting rods and the two fixing plates;
   a handle block is fixedly connected between tops of the two fixing plates;
   a guiding groove is provided on each of two side surfaces of the handle block;
   positioning protrusions configured for respectively engaging into the guiding grooves are respectively provided on clamping surfaces of the two clamping members;
   a limiting flange configured for contacting with and pressing against a bottom of the handle block is provided at a bottom of each of the clamping members.

In an embodiment, the cassette includes a bottom plate and two fixing plates;
   the two fixing plates are arranged in parallel and spaced apart at a top of the bottom plate;
   a handle block is fixedly connected between tops of the two fixing plates;
   a guiding groove is provided on each of two side surfaces of the handle block;
   positioning protrusions configured for respectively engaging into the guiding grooves are respectively provided on clamping surfaces of the two clamping members;
   a limiting flange configured for contacting with and pressing against a bottom of the handle block is provided at a bottom of each of the clamping members;
   a plurality of limiting rods are fixed on the bottom plate and between the two fixing plates; and
   an accommodating cavity for accommodating the workpiece is defined by the adjacent limiting rods and the bottom plate.

In an embodiment, a positioning block is fixed on each of two opposing side surfaces of the two fixing plates; and
   a press block configured for pressing against the workpiece is movably mounted between the two positioning blocks.

In an embodiment, the chemical solution supply mechanism includes a chemical solution supply device configured for forming the chemical solution supply module and a chemical solution discharge device;
   the chemical solution supply device includes a pump pipe and a chemical solution pump;
   one end of the pump pipe is connected to the chemical solution tank, and the other end of the pump pipe is connected to the small-capacity chemical solution tank;
   the chemical solution pump is mounted on the pump pipe, and is configured for pumping the chemical solution in the small-capacity chemical solution tank into the chemical solution tank according to the preset chemical solution supply strategy;
   the chemical solution discharge device includes a chemical solution discharge pipe and a chemical solution discharge valve;
   the chemical solution discharge pipe is connected to the chemical solution tank;
   the chemical solution discharge valve is connected to the chemical solution discharge pipe, and is configured for controlling a flow rate in the chemical solution discharge pipe according to the preset chemical solution supply strategy; and
   a liquid level sensor configured for detecting a liquid level of the chemical solution is arranged in the chemical solution tank.

In an embodiment, the chemical solution tank is provided with a chemical solution chamber and an overflow chamber configured for forming an overflow module;
   the chemical solution chamber is configured for accommodating the chemical solution supplied by the chemical solution supply mechanism and for placement of the workpiece therein;
   the overflow chamber is configured for receiving an overflow of the chemical solution from the chemical solution chamber; and
   the pump pipe and the chemical solution discharge pipe are connected to the chemical solution chamber.

In an embodiment, the chemical solution tank includes an inner tank body;
   an opening is provided at a top of the inner tank body to form an immersion inlet;
   an internal space of the inner tank body forms the chemical solution chamber;
   a connecting flange is annularly provided on an outer peripheral surface of the inner tank body;
   a side wall is connected to edges of a top surface of the connecting flange; and
   the overflow chamber is defined by the side wall, the top surface of the connecting flange, and the outer peripheral surface of the inner tank body.

In an embodiment, the chemical solution supply mechanism further includes a heating device configured for forming the heating module; and the heating device is configured for heating the chemical solution in the chemical solution chamber according to the preset chemical solution supply strategy.

In an embodiment, the chemical solution tank further includes an outer tank body;
   a bottom of the inner tank body extends into the outer tank body, and the connecting flange is connected to the outer tank body, such that a heating chamber is defined by the connecting flange, the outer tank body, and the inner tank body;

a medium input pipe and a medium output pipe which are in communication with the heating chamber are provided on the outer tank body; and the heating device is mounted in the heating chamber and is configured for heating a heat conduction medium in the heating chamber.

In an embodiment, the chemical solution supply mechanism further includes a circulation device configured for forming the circulation filtration module or a circulation spray device configured for forming the spray module;

the circulation device is configured for drawing the chemical solution from the chemical solution chamber according to the preset chemical solution supply strategy, filtering the drawn chemical solution, and returning the filtered chemical solution to the chemical solution chamber; and the circulation spray device is configured for drawing the chemical solution from the chemical solution chamber according to the preset chemical solution supply strategy, filtering the drawn chemical solution, and returning the filtered chemical solution to the chemical solution chamber by spraying.

In an embodiment, the etching system further includes a cleaning device configured for forming the cleaning module; and the cleaning device is configured for cleaning the workpiece in the chemical solution chamber.

In an embodiment, the chemical solution supply mechanism further includes a bubbling device configured for forming the bubbling module; and the bubbling device is configured for generating bubbles in the chemical solution in the chemical solution chamber according to the preset chemical solution supply strategy.

In an embodiment, the etching system further includes an etching cover device; and the etching cover device is configured for controlling opening and closing of the immersion inlet of the chemical solution chamber.

In an embodiment, the feeding system includes a conveying device and a first feeding cover device; the conveying device is configured for conveying the workpiece from a preparation position outside the machine body to a loading position in the miniaturized machine chamber;

a feeding port in communication with the miniaturized machine chamber and configured for allowing the conveyed workpiece to pass through is provided on the machine body; and the first feeding cover device is configured for controlling opening and closing of the feeding port.

In an embodiment, the feeding system further includes a second feeding cover device;

the conveying device is mounted in the lower chamber and includes a first feeding mechanism and a second feeding mechanism;

the supporting partition plate is provided with a second avoidance port for the workpiece to enter the upper chamber;

the first feeding mechanism is configured for conveying the workpiece from the preparation position to a transit position in the lower chamber;

the second feeding mechanism is configured for conveying the workpiece from the transit position to the loading position in the upper chamber; and the second feeding cover device is configured for controlling opening and closing of the second avoidance port.

As can be seen from the above technical scheme, the embodiments of the research wet etching fully automatic system designed in the present disclosure have the following beneficial effects:

1. The chemical solution supply mechanism having an automatic design is used to supply the chemical solution to the chemical solution tank according to the preset chemical solution supply strategy and control the etching environment, and then the robot module having an automatic design is used in combination with the vision module to flexibly simulate operation of a human hand to implement etching according to the preset etching strategy, such that the process can be flexibly changed to adapt to flexible scientific research scenarios.

2. The overall fully automatic control is realized to completely replace manual operation, and process parameters are accurately controlled to ensure the process stability and greatly improve the scientific research efficiency. Moreover, operation personnel do not need to manually access the tools and materials, and do not need to contact with hazardous chemical solutions, thus effectively protecting the health and safety of the operation personnel.

3. The chemical solution module and the robot module are integrated and arranged in the working space of the miniaturized machine chamber, the robot module is internally arranged at the top of the working space, and the plurality of chemical solution modules are arranged in an arc pattern. This optimizes the overall layout structure and achieves a miniaturized design, thus reducing the occupation of space in a clean room in a scientific research place, and reducing the installation and maintenance costs.

4. The etching system which can independently supply the chemical solution and control the etching environment is integrated into the machine system. As such, the size is effectively reduced compared with the enterprise-level centralized chemical solution supply design, and a miniaturized design is achieved to adapt to small-size workpiece experiments, thereby reducing the consumption of chemical solution and the amount of expensive chemical solutions used, greatly reducing scientific research costs, and providing diversified functions.

5. The design of the research wet etching fully automatic system fills the gap of existing technologies in the scientific research field for research wet etching equipment/process research, greatly improves the scientific research efficiency and process stability, and has a positive and far-reaching influence on the development of research on semiconductors, making significant technical contributions to the scientific research field, and also providing a huge boost to promoting economic development.

As can be seen from the above technical scheme, the embodiments of the research wet etching fully automatic machine designed in the present disclosure have the following beneficial effects:

1. The chemical solution supply mechanism having an automatic design is used to supply the chemical solution to the chemical solution tank according to the preset chemical solution supply strategy and control the etching environment, and then the robot module having an automatic design is used to flexibly simulate operation of a human hand to implement etching according to the preset etching strategy, such that the process can be flexibly changed to adapt to flexible scientific research scenarios.

2. With the use of the robot module in combination with the feeding system which can automatically feed the workpiece and the etching system which can automatically provide the chemical solution, the overall automatic control is realized to completely replace manual operation, and process parameters are accurately controlled to ensure the process stability and greatly improve the scientific research efficiency. Moreover, operation personnel do not need to manually access the tools and materials, and do not need to contact with hazardous chemical solutions, thus effectively protecting the health and safety of the operation personnel.

3. The integration of the system modules into the machine body optimizes the overall structure, reduces the equipment size, and achieves a miniaturized design, thus reducing the occupation of space in a clean room in a scientific research place, and reducing the installation and maintenance costs.

4. The etching system which can independently supply the chemical solution and control the etching environment is designed and integrated into the machine body. As such, the size is effectively reduced compared with the enterprise-level centralized chemical solution supply design, and a miniaturized design is achieved to adapt to small-size workpiece experiments, thereby reducing the consumption of chemical solution and the amount of expensive chemical solutions used, greatly reducing scientific research costs, and providing diversified functions of the machine.

5. The design of the research wet etching fully automatic machine fills the gap of existing technologies in the scientific research field for research wet etching equipment/process research, greatly improves the scientific research efficiency and process stability, and has a positive and far-reaching influence on the development of research on semiconductors, making significant technical contributions to the scientific research field, and also providing a huge boost to promoting economic development.

BRIEF DESCRIPTION OF DRAWINGS

To describe the technical schemes of the embodiments of the present disclosure or the related art more clearly, the following briefly introduces the accompanying drawings required for describing the embodiments or the related art. Apparently, the accompanying drawings in the following description show only some embodiments of the present disclosure, and those having ordinary skills in the art may derive other drawings from these accompanying drawings without creative efforts.

Figure 1:
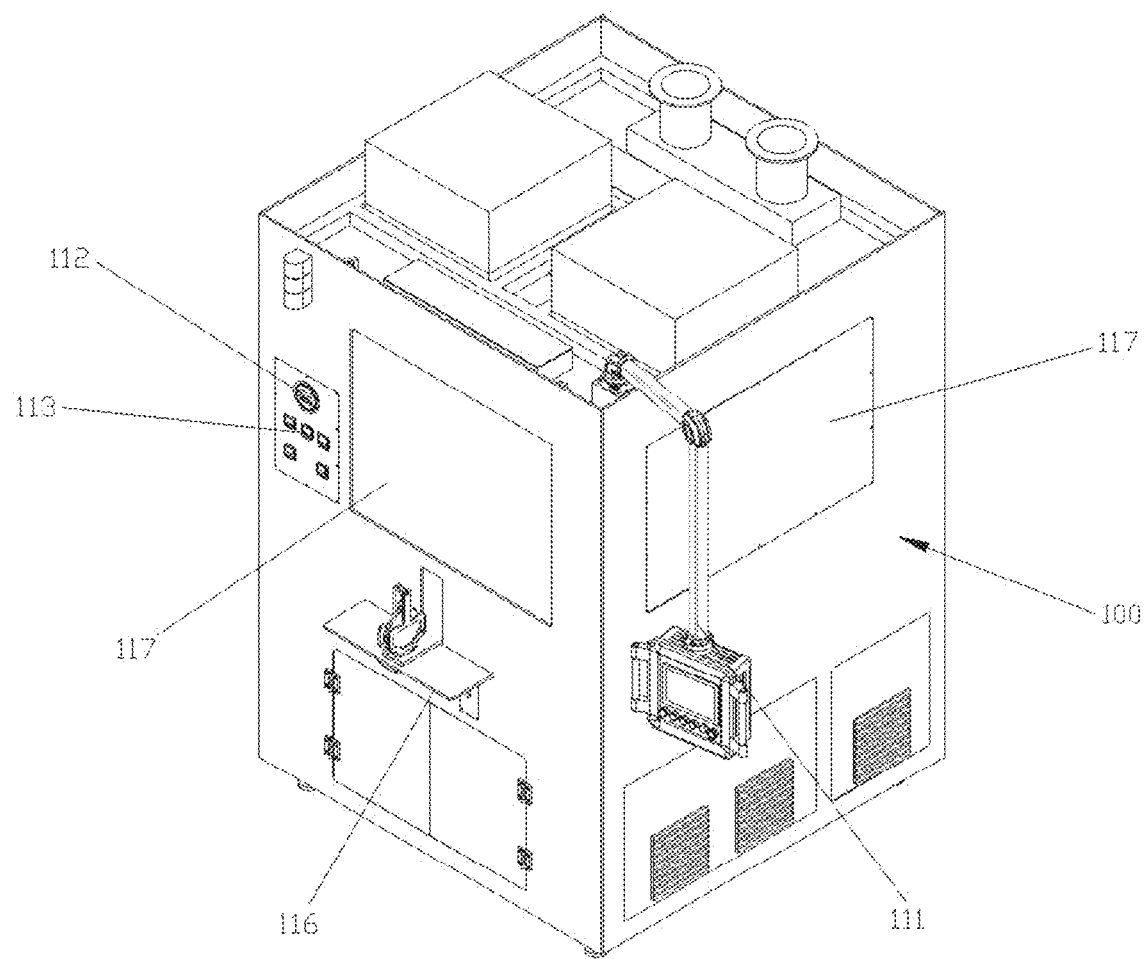
FIG. 1 is a perspective view of a research wet etching fully automatic machine according to the present disclosure.

In the drawings, the reference numerals respectively represent:
1. control system;
2. robot system; 21. robot module; 22. vision module;
3, etching system; 31. chemical solution module; 32. chemical solution supply mechanism; 33. chemical solution supply module; 34, etching environment module;
4. feeding system; 5. human-computer interaction system; 6. timing system; 7. monitoring system; 8. machine system; 9. cleaning system;
100. machine body; 101. supporting partition plate; 102. first avoidance port; 103. first drainage hole; 104. water collecting portion; 105. second drainage hole; 106. fan filter unit; 107. explosion-proof illumination device; 108. movable device; 109. spray assembly; 110. support cylinder; 111. electronically controlled cantilever; 112. pressure gauge; 113. temperature gauge; 114. chemical solution stock chamber; 115. electric control chamber; 116. loading table; 117. observation window;
201. clamping driving assembly; 202. clamping member; 203 protective cover; 204. clamping mechanism; 205. cassette; 206. fixing plate; 207. connecting rod; 208. press block; 209. positioning block; 210. handle block; 211. guiding groove; 212. positioning protrusion; 213. limiting flange; 214. insertion groove;
301. chemical solution tank; 302. inner tank body; 303. connecting flange; 304. side wall; 305. chemical solution chamber; 306. overflow chamber; 307. overflow recovery port; 308. chemical solution inlet; 309. chemical solution discharge port; 310. chemical solution discharge valve; 311. heating chamber; 312. heating device; 313, etching end cover; 314. cover driver; 315. cleaning device;
401. first feeding cover device; 402. conveying device; 403. plate driver; 404. baffle plate; 405. first feeding mechanism; 406. second feeding mechanism; 407. first carrying member; 408. avoidance slot; 409. second carrying member;
500. workpiece;
600. small-capacity chemical solution tank.

DETAILED DESCRIPTION

The following clearly and completely describes the technical schemes in the embodiments of the present disclosure in conjunction with the accompanying drawings in the embodiments of the present disclosure. Apparently, the described embodiments are merely some embodiments of the present disclosure rather than all of the embodiments. All other embodiments obtained by those having ordinary skills in the art based on the embodiments of the present disclosure without making creative efforts shall fall within the protection scope of the present disclosure.

In the description of the embodiments of the present disclosure, it should be noted that the orientation or positional relationships indicated by the terms "center", "upper", "lower", "left", "right", "vertical", "horizontal", "inner", "outer", etc., are based on the orientation or positional relationships shown in the drawings, and are only for the convenience of describing the embodiments of the present disclosure and simplifying the description, rather than indicating or implying that the apparatus or element described must have a specific orientation or be constructed and operated in a specific orientation, and therefore are not to be construed as limiting the embodiments of the present disclosure. In addition, the terms "first", "second" and the like are used herein for purposes of description, and are not intended to indicate or imply relative importance.

In the description of the embodiments of the present disclosure, it should be noted that unless otherwise specified and limited, the terms "mounted", "coupled" and "connected" should be understood in a broad sense, for example, fixed connections, detachable connections, or integral connections; may also be mechanical connections, or electric connections; may also be direct connections, or indirect connections via intervening structures; may also be inner communications or interaction of two elements. The specific meaning of the above terms within the present disclosure may be understood by those having ordinary skills in the art according to specific circumstances.

It is found through research that conventional enterprise-level fully automatic wet-processing equipment has the following shortcomings:

1. The conventional enterprise-level fully automatic wet-processing equipment cannot adapt to flexible scientific research scenarios, and their operation logic is relatively fixed and can only complete predetermined simple and repetitive tasks.

2. The conventional enterprise-level fully automatic wet-processing equipment is designed for mass production of mini-cassettes (4/6/8/12 inches, 25 pieces), which is not suitable for small-size wafers.

3. The conventional enterprise-level fully automatic wet-processing equipment requires the use of a large amount of chemical solutions, resulting in waste, inconvenience in replacement, and safety issues during storage. In scientific research, the chemical solutions are used in a small amount (about tens to hundreds of milliliters), are expensive (several hundred to tens of thousands of yuan/liter), and require stringent storage conditions. Enterprise-level fully automatic wet-processing equipment is designed for mass production of enterprises (such as solar cell factories, etc.), and consumes a large amount of chemical solutions. When a centralized chemical solution supply method is adopted, the chemical solution storage reservoir has a large storage capacity (20 L to 1000 L) and a large tank capacity (20 L to 50 L). The chemical solution needs to be replaced regularly (usually 1 day to 2 weeks in factories), which consumes labor and material resources. Although the amount of chemical solution can be appropriately saved by reducing the frequency of chemical solution replacement, prolonged non-replacement of the chemical solution will lead to problems such as decreased cleanliness, reagent volatilization, and unsafe storage. In particular, the high-temperature chemical solutions are generally mixed for immediate use. In addition, chemical solution supply via a Center Chemical solution Dispense System (CDS) requires the chemical solution to pass through a long pipeline, and there will be chemical solution residues in the pipeline. If such residues are not cleaned timely, the quality of the chemical solution supply will be affected. Even the process of pumping the chemical solution from the buffer tank into the cleaning tank suffers from a certain temperature loss, concentration loss, etc. In scientific research, a small-capacity chemical solution barrel (several hundred milliliters to several liters) is usually used, which is convenient for operation personnel to access and does not need to be replaced regularly. The fully automatic wet-processing equipment requires the use of a large amount of chemical solutions, which needs to be replaced regularly by professionals (with relevant qualifications). Laboratories in colleges and universities are usually not equipped with relevant personnel, and wet-processing equipment manufacturers on the market generally do not provide the chemical solution replacement service.

The manual operation mode in scientific research has the following shortcomings:

1. The assistance of small-size equipment is required, which is inconvenient to operate. Usually, it is necessary to use a water bath, an ultrasonic cleaner, etc., for heating or shaking. Many operations need to be performed manually, wasting the energy of researchers.

2. The process control is inaccurate and the scientific research efficiency is low. The temperature, liquid concentration, rotation speed, etc., are controlled by simply equipped devices, which are not accurate enough, resulting in a low repetition rate and affecting the scientific research efficiency.

Figure 15:
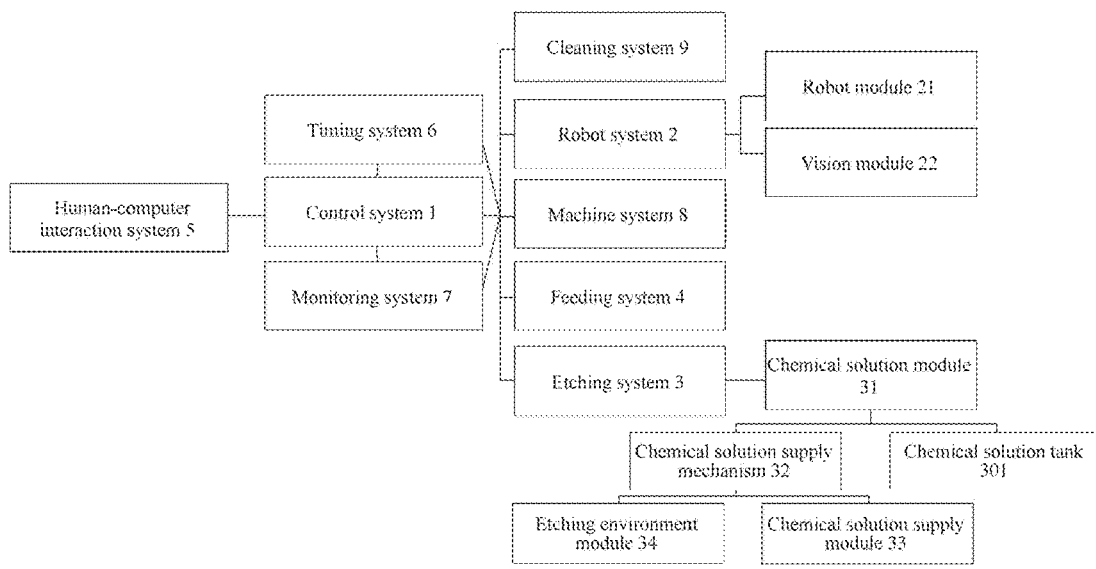
FIG. 15 is a block diagram of a research wet etching fully automatic system according to the present disclosure.

To better solve the above problems, embodiments of the present disclosure disclose a research wet etching fully automatic system. As shown in FIG. 15, the research wet etching fully automatic system includes:

a machine system 8, an etching system 3, a feeding system 4, a robot system 2, and a control system 1.

The machine system 8 is configured for providing a miniaturized machine chamber including an installation space and a working space. It should be noted that "miniaturized machine chamber" is a specific term, and does not indicate that the machine chamber is small.

The etching system 3 includes a plurality of chemical solution modules 31 arranged in an arc pattern in the miniaturized machine chamber. Each of the chemical solution modules 31 includes a chemical solution tank 301 and a chemical solution supply mechanism 32. The chemical solution supply mechanism 32 is configured for supplying a chemical solution to the chemical solution tank 301 according to a preset chemical solution supply strategy and controlling an etching environment in the chemical solution tank 301.

The arrangement pattern of the chemical solution modules 31 is improved from the conventional linear arrangement pattern to an arc pattern, preferably a circumferential arrangement pattern, to save space and make the movement trajectory of the robot module 21 more flexible.

The feeding system 4 is configured for implementing automatic transportation of a workpiece.

The robot system 2 includes a robot module 21 and a vision module 22 communicatively connected to the robot module 21. The robot module 21 is internally arranged at a top of the working space, and is configured for gripping the workpiece according to image information fed back by the vision module 22, and placing the workpiece into the chemical solution tank 301 for etching according to a preset etching strategy.

The control system 1 is communicatively connected to the machine system 8, the feeding system 4, the robot system 2, and the etching system 3, and is configured for implementing automatic etching operation according to a user instruction.

The embodiments of the research wet etching fully automatic system designed in the present disclosure have the following beneficial effects:

1. The chemical solution supply mechanism 32 having an automatic design is used to supply the chemical solution to the chemical solution tank 301 according to the preset chemical solution supply strategy and control the etching environment, and then the robot module 21 having an automatic design is used in combination with the vision module 22 to flexibly simulate operation of a human hand to implement etching according to the preset etching strategy, such that the process can be flexibly changed to adapt to flexible scientific research scenarios.

2. The overall fully automatic control is realized to completely replace manual operation, and process parameters are accurately controlled to ensure the process stability and greatly improve the scientific research efficiency. Moreover, operation personnel do not need to manually access the tools and materials, and do not need to contact with hazardous chemical solutions, thus effectively protecting the health and safety of the operation personnel.

3. The chemical solution module 31 and the robot module 21 are integrated and arranged in the working space of the miniaturized machine chamber, the robot module 21 is internally arranged at the top of the working space, and the plurality of chemical solution modules 31 are arranged in an arc pattern. This optimizes the overall layout structure and achieves a miniaturized design, thus reducing the occupation of space in a clean room in a scientific research place, and reducing the installation and maintenance costs. (To maintain cleanliness class 100 and environmental requirements of equipment in the clean room, many measures (circulating air, temperature control, anti-microvibration, ultrapure water, etc.) need to be taken, leading to high operation and maintenance costs. Therefore, the reduction in the occupation of space in the clean room can greatly reduce installation and maintenance costs).

4. The etching system 3 which can independently supply the chemical solution and control the etching environment is integrated into the machine system 8. As such, the size is effectively reduced compared with the enterprise-level centralized chemical solution supply design, and a miniaturized design is achieved to adapt to small-size workpiece experiments (such as 1 cm to 2 cm small workpieces), thereby reducing the consumption of chemical solution and the amount of expensive chemical solutions used, greatly reducing scientific research costs, and providing diversified functions.

5. The design of the research wet etching fully automatic system fills the gap of existing technologies in the scientific research field for research wet etching equipment/process research, greatly improves the scientific research efficiency and process stability, and has a positive and far-reaching influence on the development of research on semiconductors, making significant technical contributions to the scientific research field, and also providing a huge boost to promoting economic development.

In an embodiment, the robot module 21 is further configured for gripping a cleaning tool according to the image information fed back by the vision module 22 to execute a cleaning action.

It can be understood that the robot module 21 is designed to be able to execute the cleaning action. In particular, the vision module 22 acquires an image of the interior of the machine chamber and identifies a dirty position in the image. The robot module 21 grips the cleaning tool and cleans the dirty position. By additionally providing the robot module 21 with a visual recognition function, the robot module 21 is enabled to perform targeted cleaning operation at the working area. The robot module 21 combined with the vision module 22 can not only realize cleaning work, but also adopt a 6S management approach to perform extended functions such as organizing the work surface, to improve the working efficiency.

If the robot module 21 does not have a cleaning function, a special cleaning system 9 for executing a cleaning operation may be additionally provided. The cleaning system 9 may include at least one of a purge cleaning device and a spray cleaning device.

In an embodiment, the robot module 21 is designed to be able to not only execute an action of gripping the workpiece (sample gripping), an action of placing the workpiece in the chemical solution tank 301 (sample placement), and an action of driving the workpiece to move (conveying), but also execute at least one of a telescoping operation, a rotation operation, and a shaking operation. It can be understood that:

1. The robot module 21 has a telescopic function, i.e., it is equipped with a telescopic mechanism or module, which can execute a telescoping action to change the overall length as required, thereby enabling the robot module 21 to cover a wider range to adapt to different working scenarios and operation requirements.

2. The robot module 21 has a shaking function, i.e., it is equipped with a shaking mechanism or module, which can execute a shaking action. As such, the robot module 21 can simulate a shaking action of a human hand to realize etching strategy operations such as shaking and vibrating of the workpiece or material, so as to meet specific process requirements. Particularly, the robot module 21 may shake the chemical solution tank 301 or the workpiece at a set frequency and amplitude for a specified time to promote mixing or reaction.

3. The robot module 21 has a rotating function, i.e., it is equipped with a rotating mechanism or module, which can execute a rotating action to realize an etching strategy operation of driving the workpiece to rotate in the chemical solution tank 301 to complete a specific process step or task. Particularly, the robot module 21 may rotate the chemical solution tank 301 or the workpiece at a set speed and direction within a specified time to achieve stirring and mixing.

In an embodiment, the research wet etching fully automatic system further includes a timing system 6. The timing system 6 is configured for acquiring running time information of the machine system 8, the feeding system 4, and the robot system 2 and feeding back the running time information to the control system 1, such that the control system 1 controls the machine system 8, the feeding system 4, the robot system 2, and the etching system 3 according to a preset time strategy. For example, the timing system 6 is used to cause the robot module 21, the chemical solution supply mechanism 32, and the like to perform actions or operations according to a preset time interval, e.g., adding the chemical solution regularly or gripping samples regularly, so as to realize stable control on process parameters and time.

In an embodiment, the research wet etching fully automatic system further includes a human-computer interaction system 5 and a monitoring system 7.

The human-computer interaction system 5 is communicatively connected to the control system 1, to realize human-computer interaction between operation personnel and the system modules. For example, through the human-computer interaction system, operation personnel can conveniently send various execution instructions to the system modules to control the execution actions, functions, etc., of the system modules, or to acquire various running data of the system modules.

The monitoring system 7 is configured for respectively acquiring running data of the machine system 8, the robot system 2, the etching system 3, and the feeding system 4, and sending out an alarm when the running data exceeds a threshold. The monitoring system 7 is further configured for monitoring the machine system 8, the robot system 2, the etching system 3, and the feeding system 4 in real time according to a preset monitoring strategy.

In an embodiment, the chemical solution supply mechanism 32 includes a chemical solution supply module 33 and an etching environment module 34.

The chemical solution supply module 33 is configured for supplying a chemical solution in a small-capacity chemical solution tank 600 to the chemical solution tank 301, and has a chemical solution supply function, a chemical solution formulation function, and a liquid level control function. It should be noted that "small-capacity chemical solution tank" is a specific term, which does not indicate that the chemical solution tank is small. Of course, because a miniaturized design is achieved by optimizing the overall structure in the present disclosure, the size of the small-capacity chemical solution tank 600 connected thereto is also small. Using the small-capacity and small-volume chemical solution tank can further save the chemical solution.

The etching environment module 34 includes at least one of a heating module, a bubbling module, an ultrasonic vibration module, a cleaning module, a spray module, and a circulation filtration module.

It can be understood that, under the control of the etching environment module 34, the chemical solution tank 301 has a heating function, a bubbling function, an ultrasonic vibration function, a cleaning function, a spraying function, a circulation filtration function, and the like. The control of the etching environment is realized based on these functions. For example, an etching environment with circulation filtration, spraying and heating at a preset temperature is created, an etching environment with circulation filtration and bubbling is created, an etching environment with bubbling and ultrasonic vibration is created, or an etching environment with chemical solution spraying and bubbling is created. The implementation of this strategy may be realized by the chemical solution supply mechanism 32 in cooperation with the human-computer interaction system 5, the timing system 6, and the like.

The chemical solution tank 301 is provided with an overflow recovery module to achieve an overflow function.

The research wet etching fully automatic system designed above has the advantages of high degrees of intelligence and miniaturization, and can be flexibly applied to various scientific research scenarios, thus improving the scientific research efficiency, saving scientific research resources, ensuring the safety of personnel and equipment, and providing high commercial value and economic benefits.

An embodiment of the present disclosure further discloses a research wet etching fully automatic machine, which is constructed based on the research wet etching fully automatic system designed above.

Figure 2:
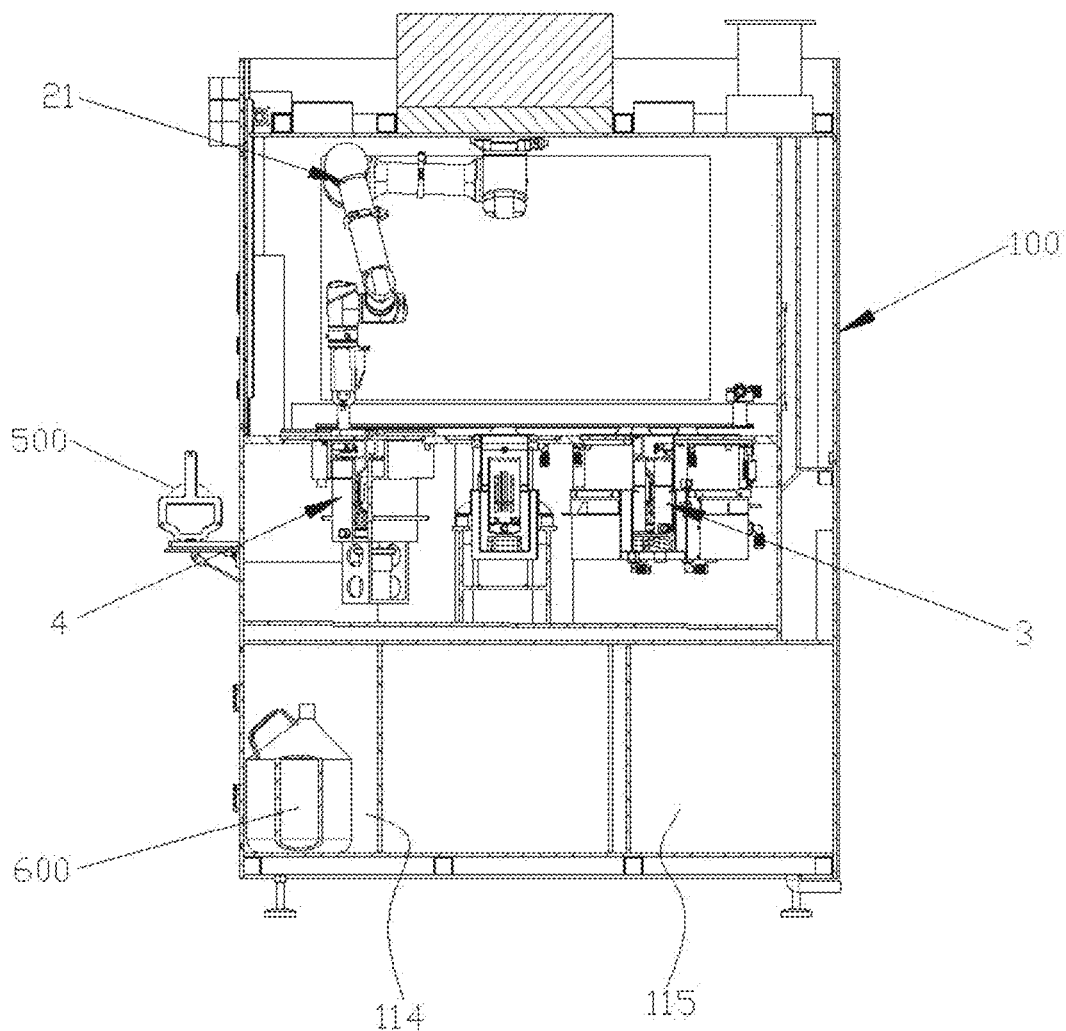
FIG. 2 is a sectional view of a research wet etching fully automatic machine according to the present disclosure.

Referring to FIG. 1, FIG. 2, and FIG. 15, an embodiment of the present disclosure provides a research wet etching fully automatic machine, which includes:
 a machine body 100 and a research wet etching fully automatic system.

The research wet etching fully automatic system is arranged on the machine body and includes a machine system 8, an etching system 3, a feeding system 4, a robot system 2, and a control system 1.

The machine system 8 is configured for providing a miniaturized machine chamber including an installation space and a working space.

The etching system 3 includes a plurality of chemical solution modules 31 arranged in an arc pattern in the miniaturized machine chamber. Each of the chemical solution modules 31 includes a chemical solution tank 301 and a chemical solution supply mechanism 32. The chemical solution supply mechanism 32 is configured for supplying a chemical solution to the chemical solution tank 301 according to a preset chemical solution supply strategy and controlling an etching environment in the chemical solution tank 301.

The feeding system 4 is configured for conveying a workpiece 500 into the working space and closing the working space after the conveying is completed.

The robot system 2 includes a robot module 21 and a vision module 22 communicatively connected to the robot module 21. The robot module 21 is internally arranged at a top of the working space, and is configured for gripping the workpiece 500 according to image information fed back by the vision module 22, and placing the workpiece into the chemical solution tank 301 for etching according to a preset etching strategy.

The control system 1 is communicatively connected to the machine system 8, the feeding system 4, the robot system 2, and the etching system 3, and is configured for implementing automatic etching operation according to a user instruction.

The research wet etching fully automatic machine designed in this embodiment or the combination of the machine and the modules thereof has all or part of the following beneficial effects:

1. The chemical solution supply mechanism 32 having an automatic design is used to create an etching environment in the chemical solution tank according to the preset chemical solution supply strategy, and then the robot module 21 having an automatic design is used to flexibly simulate operation of a human hand to implement etching according to the preset etching strategy, such that the process can be flexibly changed to adapt to flexible scientific research scenarios.

2. With the use of the robot module 21 in combination with the feeding system 4 which can automatically feed the workpiece and the etching system 3 which can automatically provide the chemical solution, the overall automatic control is realized to completely replace manual operation, and process parameters are accurately controlled to ensure the process stability and greatly improve the scientific research efficiency. Moreover, operation personnel do not need to manually access the tools and materials, and do not need to contact with hazardous chemical solutions, thus effectively protecting the health and safety of the operation personnel.

3. Furthermore, according to common processes in scientific research, the system modules are integrated into the machine body 100, to optimize the overall structure, reduce the equipment size, and achieve a miniaturized design, so as not to occupy too much space in the clean room of the scientific research institute. In addition, the position of the machine can be conveniently and flexibly adjusted, so as not to interfere with the personnel during use. To achieve flexible movement, a pulley device, a fixing device, and an anti-corrosion pad are arranged at the bottom of the machine body 100, such that the height of the machine can be adjusted and the machine can be tightly fixed to ground, thus preventing the machine from shaking or trembling during operation of the robot module 21. When multiple machine bodies 100 are used, different processes may be performed by different machine bodies 100, and a removable etching system 3 is reserved for each machine body 100 to improve the flexibility of use.

4. The etching system 3 which can independently supply the chemical solution and control the etching environment is designed and integrated into the machine body 100. As such, the size is effectively reduced compared with the enterprise-level centralized chemical solution supply design, and a miniaturized design is achieved to adapt to small-size workpiece experiments, thereby reducing the consumption of chemical solutions and the amount of expensive chemical solutions used, greatly reducing scientific research costs, and providing diversified functions of the machine body 100.

5. The design of the research wet etching fully automatic machine fills the gap of existing technologies in the scientific research field for research wet etching equipment/process research, greatly improves the scientific research efficiency and process stability, and has a positive and far-reaching influence on the development of research on semiconductors, making significant technical contributions to the scientific research field, and also providing a huge boost to promoting economic development.

The above description is Embodiment One of the research wet etching fully automatic machine provided by the embodiments of the present disclosure, and the following describes Embodiment Two of the research wet etching fully automatic machine provided by the embodiments of the present disclosure. Reference may be made to FIG. 1 to FIG. 15 for details.

The following is described based on the scheme of Embodiment One of the research wet etching fully automatic machine.

In an embodiment, the robot module 21 is designed to be able to not only execute an action of gripping the workpiece (sample gripping), an action of placing the workpiece in the chemical solution tank 301 (sample placement), and an action of driving the workpiece to move (conveying), but also execute at least one of a telescoping operation, a rotation operation, and a shaking operation. It can be understood that:

1. The robot module 21 has a telescopic function, i.e., it is equipped with a telescopic mechanism or module, which can execute a telescoping action to change the overall length as required, thereby enabling the robot module 21 to cover a wider range to adapt to different working scenarios and operation requirements.

2. The robot module 21 has a shaking function, i.e., it is equipped with a shaking mechanism or module, which can execute a shaking action. As such, the robot module 21 can simulate a shaking action of a human hand to realize etching strategy operations such as shaking and vibrating of the workpiece or material, so as to meet specific process requirements. Particularly, the robot module 21 may shake the chemical solution tank 301 or the workpiece at a set frequency and amplitude for a specified time to promote mixing or reaction.

3. The robot module 21 has a rotating function, i.e., it is equipped with a rotating mechanism or module, which can execute a rotating action to realize an etching strategy operation of driving the workpiece to rotate in the chemical solution tank 301 to complete a specific process step or task. Particularly, the robot module 21 may rotate the chemical solution tank 301 or the workpiece at a set speed and direction within a specified time to achieve stirring and mixing.

Since the operation environment of the robot module 21 involves flammable and explosive hazardous materials such as acid, alkali, organic materials, etc., the robot module 21 should be designed with satisfactory explosion-proof and anti-corrosion performance. In terms of explosion-proof design for enhanced safety, an explosion-proof material and an explosion-proof device may be used in the mechanical structure and electrical system of the robot module 21 to ensure that no fire or explosion accident will be caused in the flammable and explosive environment. In terms of anti-corrosion design for enhanced safety, an anti-corrosion material or special coating treatment is employed on the housing and key components of the robot module 21 to prevent corrosive materials such as acid and alkali from causing damage to the robot module 21.

In the present disclosure, the robot module 21 is designed to have functions of gripping the workpiece 500 (sample gripping), placing the workpiece 500 into the chemical solution tank 301 (sample placement), and driving the workpiece 500 to move (conveying). Two designs may be used for sample gripping and sample placement.

In a first design, sample gripping is performed by lifting a cassette 205 holding the workpiece 500. The cassette 205 is adaptively designed according to the size of the workpiece 500 to be experimented, so as to meet the need of holding a small-size workpiece 500.

In a second design, sample gripping is performed by directly gripping the workpiece 500 from the tooling. This method has the following characteristics. 1. The workpiece 500 is clamped from two sides, ensuring that the surface of the workpiece 500 is not affected, and a rectangular wafer of 1 cm to 2 cm can be firmly and flexibly clamped. 2. The precision of force is controlled to be 0.01 N, ensuring that the workpiece does not easily break. 3. The functions of picking, placing, and transferring samples are realized.

Both the two sample gripping designs can meet the sample gripping needs in different scenarios, and especially, the capability of processing workpieces 500 such as small-size wafers is further improved.

The robot module 21 implements automatic control through the control system 1, to control the positioning precision for sample placement and the transfer speed of the sample, thus effectively solving the process problems such as photoresist uniformity, temperature change, and corrosion time control, and improving the process stability.

The robot module 21 may also be designed to have a cleaning function to clean a working area inside the machine body 100.

Cleaning Control Method One: The robot module 21 grips the cleaning tool and cleans the upper chamber according to a preset cleaning trajectory. Particularly, the robot module 21 can grip a cleaning tool having a dust-free paper or cloth to simulate a wiping action of a human hand for cleaning. The robot module 21 may be configured to be able to suck the cleaning tool.

Cleaning Control Method Two: The vision module 22 is used to acquire an image of the interior of the machine chamber and identify a dirty position in the image. The robot module 21 grips the cleaning tool and cleans the dirty position. By additionally providing the robot module 21 with a visual recognition function, the robot module 21 is enabled to perform targeted cleaning operation at the working area. The robot module 21 combined with the vision module 22 can not only realize cleaning work, but also adopt a 6S management approach to perform extended functions such as organizing the work surface, to improve the working efficiency.

The arrangement of the vision module also enables more accurate interconnection between the robot module 21, the feeding system 4, and the etching system 3, and realizes highly intelligent operations to improve the production efficiency and precision.

The robot module 21 in Cleaning Control Method One and Cleaning Control Method Two may be an additionally provided independent robot module specially used for cleaning, thus achieving a dual-robot module design.

In an embodiment, the research wet etching fully automatic machine further includes a timing system 6. The timing system 6 is configured for acquiring a running time of the robot module 21 and controlling the operation of the robot module 21 according to a preset running time strategy. It can be understood that, the timing system 6 is used to cause the robot module 21, the chemical solution supply mechanism 32, and the like to perform operations according to a preset time interval, e.g., adding the chemical solution regularly or gripping samples regularly, so as to realize stable control on process parameters and time.

In an embodiment, if the robot module 21 does not have a cleaning function, a special cleaning system 9 may be additionally provided. The cleaning system 9 is arranged on the machine body 100 and is configured for cleaning the interior of the machine chamber. The cleaning system 9 includes at least one of a purge cleaning device and a spray cleaning device, to implement nitrogen purge cleaning, spray cleaning, etc.

In an embodiment, the research wet etching fully automatic machine further includes a human-computer interaction system 5 and a monitoring system 7.

The human-computer interaction system 5 is communicatively connected to the control system 1, to realize human-computer interaction between the operation personnel and the system modules. For example, through the human-computer interaction system, the operation personnel can conveniently send various execution instructions to the system modules to control the execution actions, functions, etc., of the system modules, or to acquire various running data of the system modules.

As shown in FIG. 1, the human-computer interaction system 5 in the present disclosure includes an electronically controlled cantilever 111 fixed to the machine body 100, and/or a remote-control terminal device, etc.

The monitoring system 7 is configured for respectively acquiring running data of the machine system 8, the robot system 2, the etching system 3, and the feeding system 4, and sending out an alarm when the running data exceeds a threshold. The monitoring system 7 is further configured for monitoring the machine system 8, the robot system 2, the etching system 3, and the feeding system 4 in real time according to a preset monitoring strategy.

The monitoring system 7 includes various types of sensors, such as a temperature sensor for detecting the temperature of the chemical solution in the chemical solution tank 301, a liquid level sensor for detecting the amount of the chemical solution in the chemical solution tank 301, an air pressure sensor for detecting the air pressure of the working area in the machine chamber, etc. As shown in FIG. 1, an air pressure gauge 112 and a temperature gauge 113 may be arranged on a front surface of the machine body 100.

In an embodiment, the chemical solution supply mechanism 32 includes a chemical solution supply module 33 and an etching environment module 34.

The chemical solution supply module 33 is configured for supplying a chemical solution in a small-capacity chemical solution tank 600 to the chemical solution tank 301, and has a chemical solution supply function, a chemical solution formulation function, and a liquid level control function. It should be noted that "small-capacity chemical solution tank" is a specific term, which does not indicate that the chemical solution tank is small. Of course, because a miniaturized design is achieved by optimizing the overall structure in the present disclosure, the size of the small-capacity chemical solution tank 600 connected thereto is also small. Using the small-capacity and small-volume chemical solution tank can further save the chemical solution.

The etching environment module 34 includes at least one of a heating module, a bubbling module, an ultrasonic vibration module, a cleaning module, a spray module, and a circulation filtration module.

It can be understood that, under the control of the etching environment module 34, the chemical solution tank 301 has a heating function, a bubbling function, an ultrasonic vibration function, a cleaning function, a spraying function, a circulation filtration function, and the like. The control of the etching environment is realized based on these functions. For example, an etching environment with circulation filtration, spraying, and heating at a preset temperature is created, an etching environment with circulation filtration and bubbling is created, an etching environment with bubbling and ultrasonic vibration is created, or an etching environment with chemical solution spraying and bubbling is created. The implementation of this strategy may be realized by the chemical solution supply mechanism 32 in cooperation with the human-computer interaction system 5, the timing system 6, and the like.

The chemical solution tank 301 is provided with an overflow recovery module to achieve an overflow function.

An automatic scientific research scenario based on the theme of the present disclosure may be implemented as follows.

1. Upon identifying the size and position of the workpiece 500 through the vision module 22, the robot module 21 moves to a corresponding position, grips the workpiece 500, and then puts the workpiece 500 into the corresponding chemical solution tank 301.

2. When the workpiece 500 is immersed in the chemical solution tank 301, the robot module 21 can shake or rotate the workpiece 500 in the chemical solution tank 301 according to the preset interval under the control of the timing system 6, and detect whether the workpiece is broken according to a feedback from the vision module 22 or other sensor modules.

According to the present disclosure, the robot module 21 can be interconnected with the automatic function modules on the machine body 100 to achieve human-computer interconnection and a high degree of intelligence. The following functions can be realized.

1. Human-computer interconnection: The robot module 21 performs real-time data exchange and instruction transmission with the operation personnel. The operation personnel may monitor the operational statuses of the robot module 21 and the machine body 100 by means of the monitoring system 7 including a computer or a mobile device, and view experimental data and results in real time. The robot module 21 can communicate with the operation personnel or operate by means of the human-computer interaction system 5 including a voice or touch screen interface.

2. Automatic operation: The robot module 21 may be in charge of various operations such as sample gripping, chemical solution addition, stirring, heating, etc. The arrangement of the sensors and the vision module 22 enables the robot module 21 to monitor and identify the experimental environment and the status of the workpiece 500, and automatically make adjustment and make decisions.

3. Intelligent decision-making: The robot module 21 can automatically analyze the experimental data and make corresponding decisions based on a preset procedure and algorithm. For example, the robot module 21 can automatically adjust reaction conditions and the amount of chemical solution added according to real-time temperature, liquid concentration, and other parameters to achieve an optimal reaction effect.

4. Automatic fault diagnosis and maintenance: The robot module 21 can monitor the operational status of the entire wet-processing equipment by means of the monitoring system 7, and detect and report a potential fault in a timely manner. When a fault occurs, the robot module 21 can automatically stop operation, provide a preliminary analysis of the cause of the fault and recommend a repair method.

In an embodiment, as shown in FIG. 2, the robot module 21 is a multi-axis collaborative robot, specifically a 6-axis collaborative robot. Although conventional modular robots or industrial robots have strong load capacity and large operating range, they are not as flexible and intelligent as collaborative robots in terms of action, movement trajectory, operation logic, functions, etc., and cannot adapt to flexible scientific research scenarios. An industrial robot module usually has a pre-programmed movement trajectory and relatively fixed action and operation logic, and can only complete predetermined simple and repetitive tasks. A collaborative robot senses the surrounding environment in real time through human-computer interaction by means of sensors, independently makes decisions and adjusts the movement trajectory and actions according to task changes and actual situations, and therefore has higher flexibility and adaptability and can implement more complex tasks. Therefore, the robot module 21 is designed as a collaborative robot in the present disclosure.

The preset etching strategy may be summarized as a time/state change strategy for the workpiece 500 in the created etching environment. Examples are given below.

1. The immersion time strategy may be continuous immersion within a certain period of time or immersion based on a time interval. The implementation of this strategy can be realized by the robot module 21 in cooperation with the telescopic mechanism, the timing system 6, and the like.

2. The immersion state strategy may be based on a specific state change within a certain period of time. For example, the workpiece 500 is shaken at a set frequency or rotated at a set speed based on a time interval during the immersion. The implementation of this strategy may be realized by the robot module 21 in cooperation with the timing system 6, the shaking mechanism, the rotating mechanism, and the like.

Of course, the present disclosure is not limited to these control strategies, and the control strategy may be changed by those having ordinary skills in the art according to actual process requirements and is not limited herein.

Figure 3:
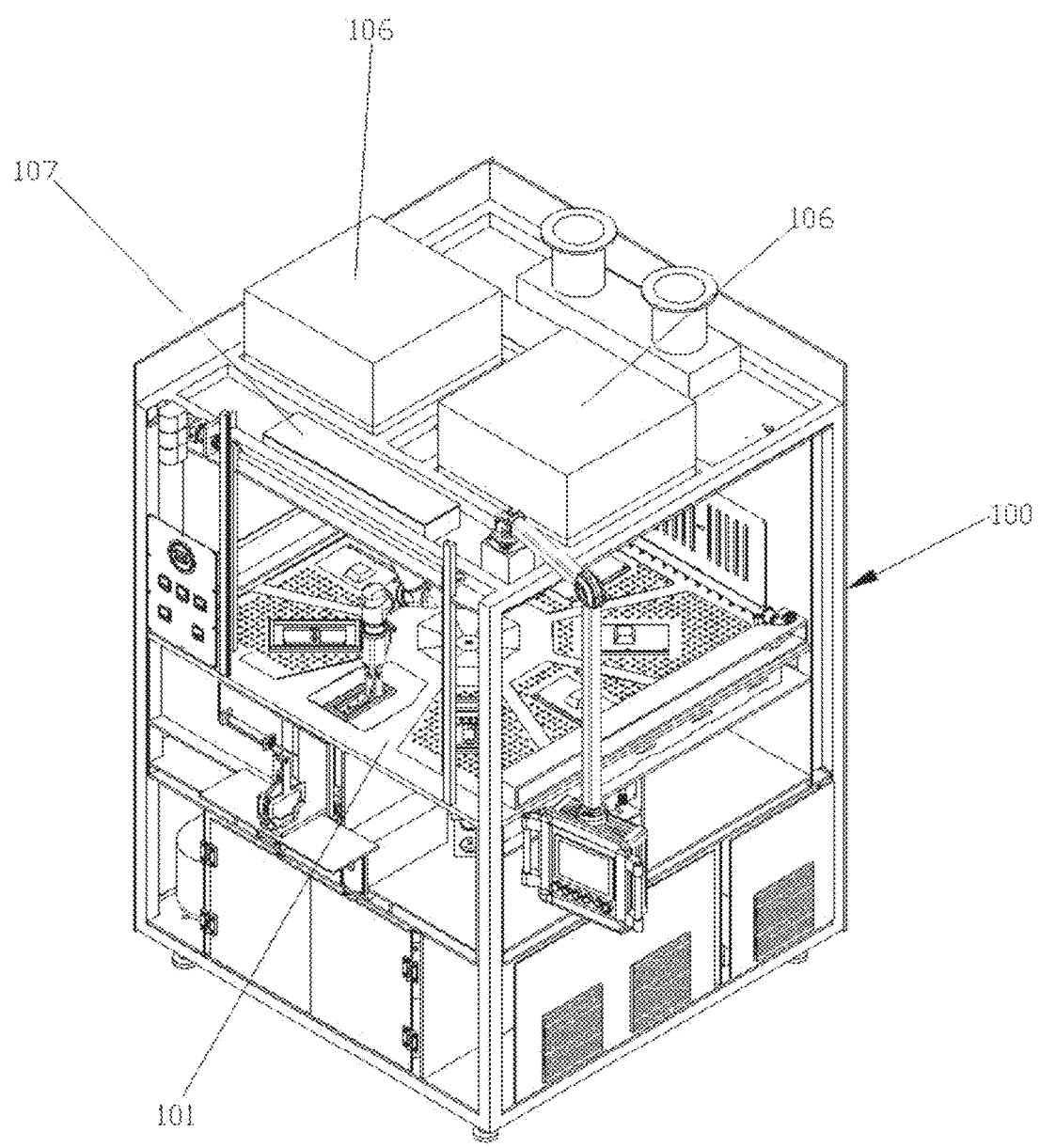
FIG. 3 is a first partial schematic diagram of a research wet etching fully automatic machine according to the present disclosure.
Figure 4:
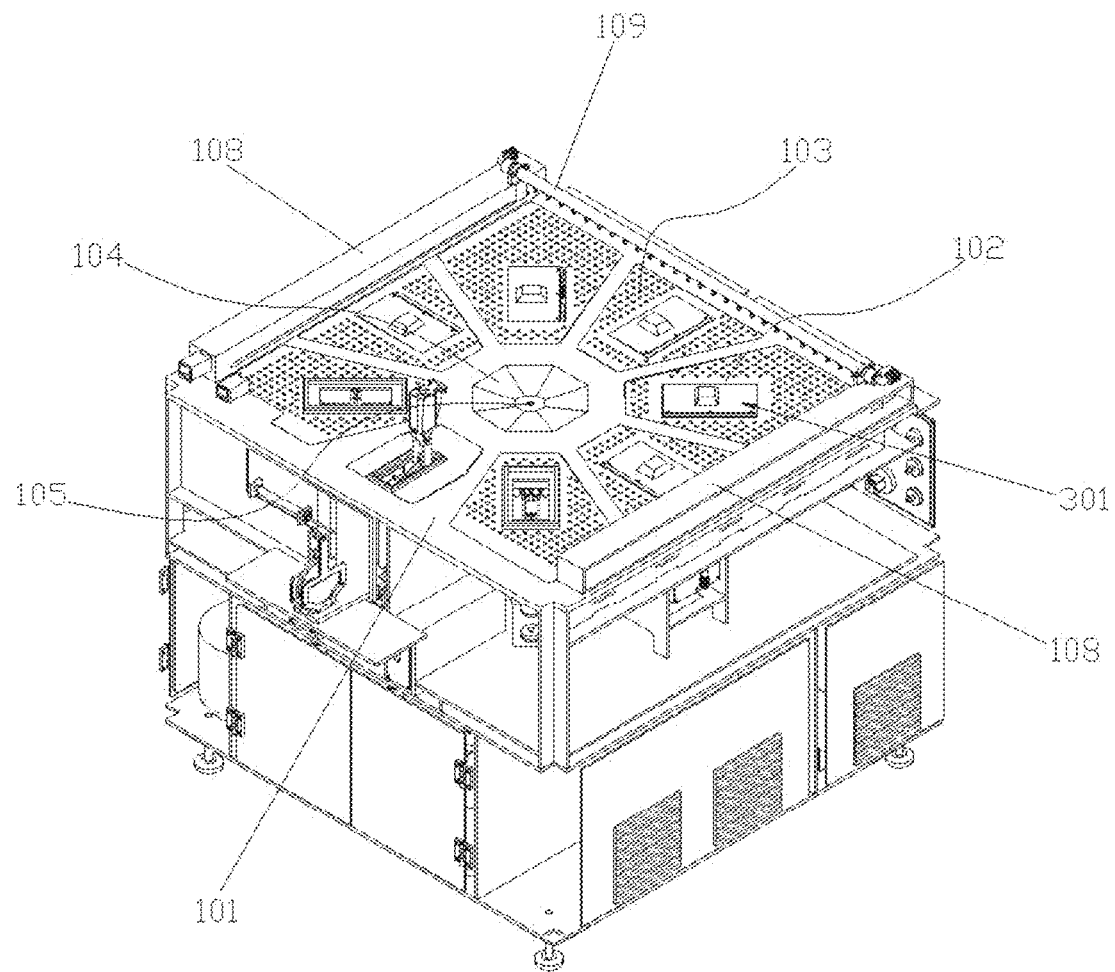
FIG. 4 is a second partial schematic diagram of a research wet etching fully automatic machine according to the present disclosure.

In an embodiment, as shown in FIG. 3 and FIG. 4, a supporting partition plate 101 is arranged in the miniaturized machine chamber, to divide the miniaturized machine chamber into an upper chamber and a lower chamber.

The robot module 21 is internally mounted at the top of the upper chamber. Such a design is aesthetic and saves space.

In an embodiment, a plurality of chemical solution tanks 301 are provided, which are arranged in a circumferential pattern in the lower chamber. The improvement of the arrangement pattern of the chemical solution tanks 301 from the conventional linear arrangement pattern to the circumferential arrangement pattern saves space and makes the movement trajectory of the robot module 21 more flexible.

The supporting partition plate 101 is provided with first avoidance ports 102 respectively in communication with the chemical solution tanks 301.

Compared with enterprise-level wet-processing equipment designs, the design of the present disclosure can reduce the number of chemical solution tanks 301 and reduce the equipment size, making it convenient for the user to use the machine and improving the utilization rate of the equipment. Because the design can reduce the equipment size, i.e., reduce the volume of the chemical solution tank 301, the amount of chemical solution used can be greatly reduced compared with enterprise-level wet-processing equipment designs.

In an embodiment, for the layout design of the machine body 100, an electric control chamber 115 and a chemical solution stock chamber 114 configured for storing the small-capacity chemical solution tank 600 shown in FIG. 2 may be provided in a space below the miniaturized machine chamber in the machine body 100. A controller of the robot module 21, a controller of the conveying device 402, and a controller of the etching system 3 are all deployed in the electric control chamber 115. All electrical appliances and wires that may come into contact with the chemical solution mist are subjected to perfluoroalkoxy alkane (PFA) anti-corrosion treatment.

In an embodiment, as shown in FIG. 3, the machine system 8 further includes a fan filter unit (FFU) 106, and the fan filter unit 106 is equipped with a high-efficiency filter device.

Assuming that the robot module 21 is internally arranged at the top of the upper chamber, the fan filter unit 106 may adopt a split-type design including two units spaced apart from each other, so as to provide more space for the mounting of the robot module 21.

The machine body 100 is provided with an air exhaust port and an air supply port in communication with the upper chamber. The fan filter unit 106 is mounted on the machine body 100 and connected to the air supply port. The fan filter unit 106 is used to ensure that the air quality of the operation area of the robot module 21 meets a requirement of cleanliness Class 100.

In an embodiment, a nitrogen gun and a pure water gun are further respectively arranged on left and right sides of a front portion of the upper chamber. The water gun is designed to drip running water to facilitate cleaning of the fragile workpiece 500.

In an embodiment, an automatic fire extinguishing system is further designed. The automatic fire extinguishing system includes sensors such as smoke sensor, temperature sensor, and open flame sensor. The automatic fire extinguishing system is designed to be able to operate in the event of a power outage.

In an embodiment, as shown in FIG. 1, the machine system 8 further includes an explosion-proof illumination device 107. The explosion-proof illumination device 107 is mounted on the machine body 100 and is configured for illuminating the upper chamber.

The machine body 100 is provided with an observation window 117 for observing the upper chamber to facilitate observation of the operation of the robot module 21. In addition, the machine body 100 is provided with an automatic vertical lift safety door, and the automatic vertical lift safety door is equipped with a mis-operation alarm device to ensure the safety of operation personnel.

In an embodiment, as shown in FIG. 4, the spray cleaning device includes a spray assembly 109 and a movable device 108. The movable device 108 is mounted in the upper chamber and connected to the spray assembly 109, and is configured for driving the spray assembly 109 to move. Two sets of movable devices 108 may be provided. In some embodiments, the movable devices 108 are linear displacement modules, which are symmetrically arranged at edge positions on two sides of the supporting partition plate 101. Driving ends of the movable devices 108 are respectively connected to the spray assembly 109 to drive the spray assembly 109 to reciprocate above the supporting partition plate 101. The spray assembly 109 is a spray pipe on which a plurality of nozzles are arranged in an array, so as to clean the work surface on the supporting partition plate 101 by spraying water.

To facilitate drainage, a plurality of first drainage holes 103 are provided in the supporting partition plate 101, and the lower chamber is provided with a main drainage pipe in communication with the outside of the machine body 100. Waste water discharged into the lower chamber through the first drainage holes 103 is then discharged out from the machine body 100 through the main drainage pipe.

In an embodiment, as shown in FIG. 4, to prevent accumulation of water on the supporting partition plate 101, a water collecting portion 104 is provided at a middle part of the supporting partition plate 101 to collect accumulated water and then discharge the accumulated water through a second drainage hole 105 provided in the water collecting portion 104. The supporting partition plate 101 may be designed to have an inclination slope from its periphery to the center, or may be designed to have an inclination slope toward a position, to achieve a better water collecting and drainage effect, which is not limited herein.

Figure 5:
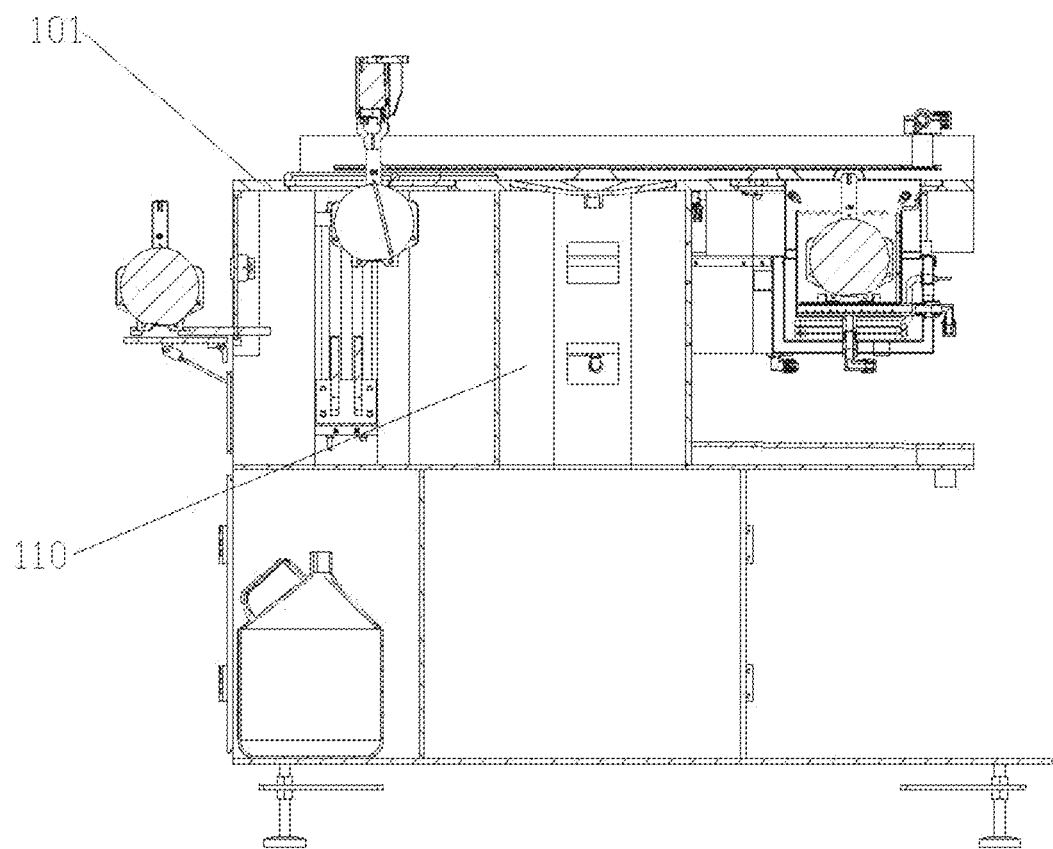
FIG. 5 is a first partial sectional view of a research wet etching fully automatic machine according to the present disclosure.

In an embodiment, as shown in FIG. 5, to prevent water leaking through the first drainage holes 103 from affecting some electric control devices, control elements, wires, pipelines, etc., a support cylinder 110 connected to the supporting partition plate 101 is provided in a middle part of the lower chamber, and an independent distribution control chamber is provided in the support cylinder 110. In addition, with such a design, the support cylinder 110 can also support and reinforce the supporting partition plate 101.

In the present disclosure, the second drainage hole 105 is designed to be in communication with the distribution control chamber. To prevent water leaking through the second drainage hole 105 from affecting the components inside the distribution control chamber, a branch drainage pipe connected to the second drainage hole 105 is arranged in the distribution control chamber, and an end of the branch drainage pipe away from the second drainage hole 105 extends out of the support cylinder 110, and particularly may directly extend out of the machine body 100.

Figure 6:
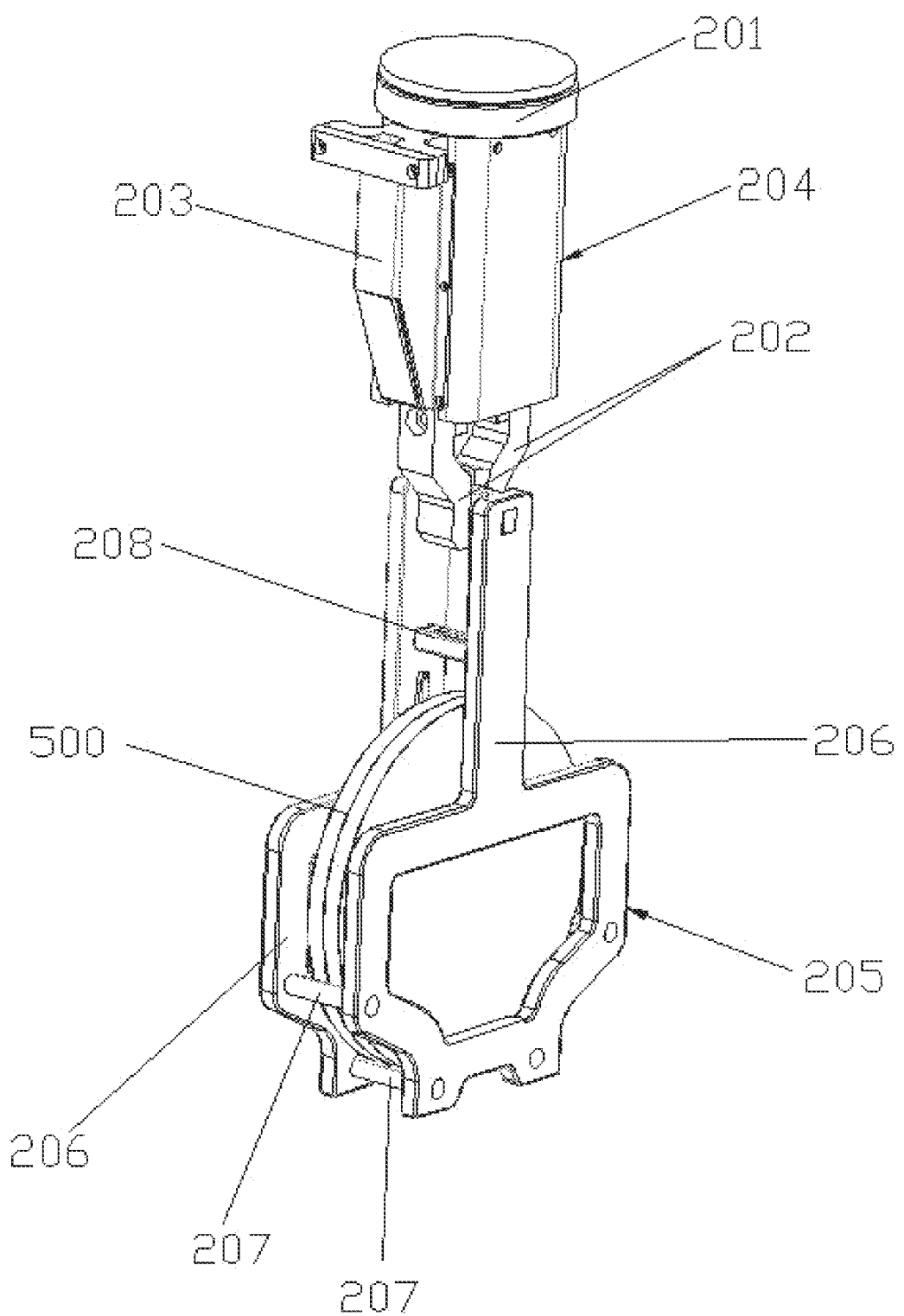
FIG. 6 is a perspective view showing cooperation between a clamping mechanism and a cassette in a research wet etching fully automatic machine according to the present disclosure.

In an embodiment, as shown in FIG. 6, to grip the workpiece 500, a cassette clamping mechanism 204 configured for gripping the cassette 205 is connected at an end of the robot module 21. Accordingly, the research wet etching fully automatic system further includes the cassette 205 for holding the workpiece, and the cassette 205 is gripped or released by the cassette clamping mechanism 204.

The cassette clamping mechanism 204 includes a clamping driving assembly 201 and two clamping members 202. The clamping driving assembly 201 is connected to the two clamping members 202 and is configured for driving the two clamping members 202 to open and close to grip the cassette 205.

To achieve satisfactory explosion-proof and anti-corrosion effects, in the present disclosure, an explosion-proof and anti-corrosion protective cover 203 is sleeved over the clamping driving assembly 201.

Figure 7:
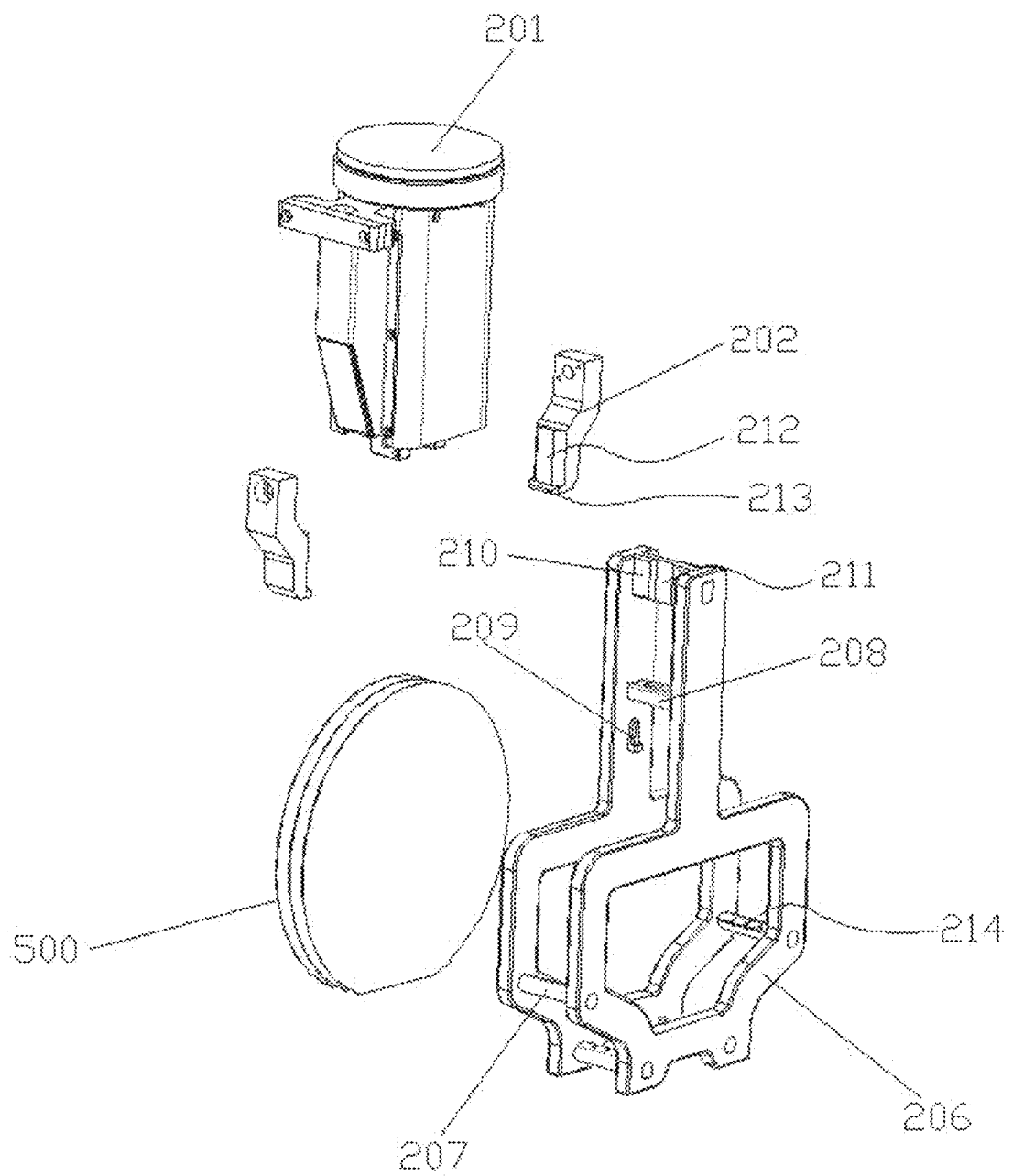
FIG. 7 is a schematic exploded view showing cooperation between a clamping mechanism and a cassette in a research wet etching fully automatic machine according to the present disclosure.

In an embodiment, as shown in FIG. 6 and FIG. 7, the cassette 205 in the present disclosure is designed for holding a small-size workpiece 500, and its design specifications are suitable for, for example, a 4/6-inch workpiece 500 and a 1 cm to 2 cm rectangular workpiece 500.

Taking the design suitable for a 4/6-inch workpiece 500 as an example, the cassette 205 includes two fixing plates 206.

The two fixing plates 206 are arranged in parallel and spaced apart, and are fixedly connected to each other by a plurality of connecting rods 207. An accommodating cavity for accommodating the workpiece 500 is defined by the connecting rods 207 and the two fixing plates 206. The workpiece 500 can enter from the two fixing plates 206, and then be placed in the defined accommodating cavity, and fixed through limiting functions of the fixing plates 206 and the connecting rods 207.

To facilitate gripping by the clamping members 202, a handle block 210 is fixedly connected between tops of the two fixing plates 206, a guiding groove 211 is provided on each of two side surfaces of the handle block 210, and positioning protrusions 212 configured for respectively engaging into the guiding grooves 211 are respectively provided on clamping surfaces of the two clamping members 202. A reliable connection between the clamping members 202 and the handle block 210 is realized through positioning fit between the positioning protrusions 212 and the guiding grooves 211.

In addition, a limiting flange 213 configured for contacting with and pressing against a bottom of the handle block 210 is provided at a bottom of each of the clamping members 202. The limiting flanges 213 can support and retain the handle block 210 to prevent the handle block 210 from falling.

In an embodiment, taking the design suitable for a 1 cm to 2 cm rectangular workpiece 500 as an example, the cassette 205 includes a bottom plate and two fixing plates 206 shown in FIG. 6 and FIG. 7.

The two fixing plates 206 are arranged in parallel and spaced apart at a top of the bottom plate. A handle block 210 is fixedly connected between tops of the two fixing plates 206. A guiding groove 211 is provided on each of two side surfaces of the handle block 210. Positioning protrusions 212 configured for respectively engaging into the guiding grooves 211 are respectively provided on clamping surfaces of the two clamping members 202. A limiting flange 213 configured for contacting with and pressing against a bottom of the handle block 210 is provided at a bottom of each of the clamping members 202.

A plurality of limiting rods are fixed on the bottom plate and between the two fixing plates 206. An accommodating cavity for accommodating the workpiece 500 is defined by the adjacent limiting rods and the bottom plate. The difference between this design scheme and the design scheme suitable for a ⅘-inch workpiece lies in the presence of the bottom plate and the formation of the accommodating cavity. The design may be changed by those having ordinary skills in the art as required and is not limited herein.

In an embodiment, as shown in FIG. 6 and FIG. 7, in the two design schemes of the cassette 205, a positioning block 209 is fixed on each of two opposing side surfaces of the two fixing plates 206. The positioning blocks 209 may be L-shaped. A press block 208 configured for pressing against the workpiece 500 is movably mounted between the two positioning blocks 209. Each of two sides of the press block 208 is provided with a notch through which a vertical portion of the corresponding positioning block 209 can move, and a horizontal portion of the positioning block 209 provides a limiting effect to prevent the mounted press block 208 from sliding downward out of the positioning block 209. With such a design, the press block 208 is vertically movable and adjustable, and can be flexibly adjusted according to the size of the workpiece 500 held, to press against workpieces 500 of various sizes, so as to prevent floating and falling of the workpiece 500 when immersed in the chemical solution, thereby ensuring the stability and safety of the small-sized workpiece 500 in the cassette 205. The positioning block 209 may be designed such that its mounting position can be adjusted, thereby expanding the range of application of the press block 208.

In an embodiment, to better position and fix the workpiece 500, as shown in FIG. 7, each of the connecting rods 207 and the limiting rods are provided with an insertion groove 214 for the workpiece 500 to engage therein.

In an embodiment, the chemical solution supply mechanism 32 includes a chemical solution supply device configured for forming the chemical solution supply module 33 and a chemical solution discharge device.

The chemical solution supply device includes a pump pipe and a chemical solution pump.

One end of the pump pipe is connected to the chemical solution tank 301, and the other end of the pump pipe is connected to the small-capacity chemical solution tank 600. The pump pipe is designed as a small bottle. The chemical solution pump is mounted on the pump pipe, and is configured for pumping the chemical solution in the small-capacity chemical solution tank 600 into the chemical solution tank 301 according to the preset chemical solution supply strategy. The chemical solution in the small-capacity chemical solution tank 600 is directly pumped into the chemical solution tank 301 through the chemical solution pump. Each small-capacity chemical solution tank 600 corresponds to one pump pipe, each pump pipe corresponds to one chemical solution pump, and one small-capacity chemical solution tank 600 can supply the chemical solution to a plurality of chemical solution tanks 301.

The chemical solution discharge device includes a chemical solution discharge pipe and a chemical solution discharge valve 310. The chemical solution discharge pipe is connected to the chemical solution tank 301.

The chemical solution discharge valve 310 is connected to the chemical solution discharge pipe, and is configured for controlling a flow rate in the chemical solution discharge pipe according to the preset chemical solution supply strategy.

A liquid level sensor configured for detecting a liquid level of the chemical solution is arranged in the chemical solution tank 301. With such a design, the liquid level can be dynamically changed, such that the liquid level can be adjusted according to etching requirements of different workpieces.

The chemical solution pump may be a pneumatic diaphragm pump, which is a low-capacity pump. By directly pumping the chemical solution into the chemical solution tank 301, the pumping time can be greatly shortened, and the waste of the chemical solution residues in the pipeline can be reduced.

During design, a centralized chemical solution supply port may be reserved for use during batch preparation.

According to the process requirements, each chemical solution tank 301 corresponds to a plurality of small-capacity chemical solution tanks 600 containing different chemical solutions, and the chemical solutions are directly mixed in the chemical solution tank 301. For chemical solutions that react violently when being mixed, an independent mixing tank may be additionally provided. A mass ratio and amount of the chemical solutions can be precisely controlled by setting the parameters of the chemical solution pump, so as to realize an automatic chemical solution formulation function. The small-capacity chemical solution tank 600 is designed as a small volumetric flask, which has a small capacity and small volume, thereby further saving the chemical solution.

Figure 9:
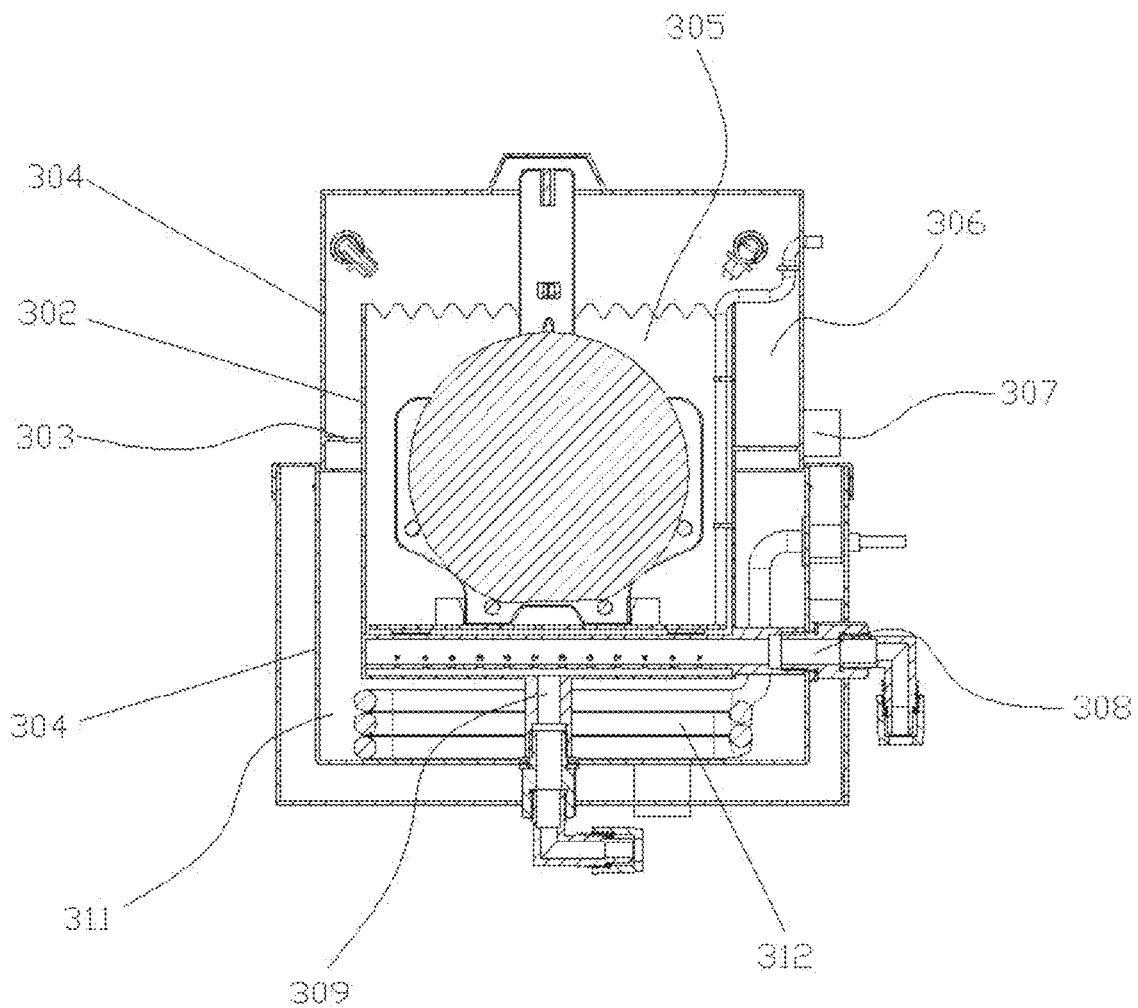
FIG. 9 is a sectional view of a chemical solution tank designed with a heating device in a research wet etching fully automatic machine according to the present disclosure.
Figure 12:
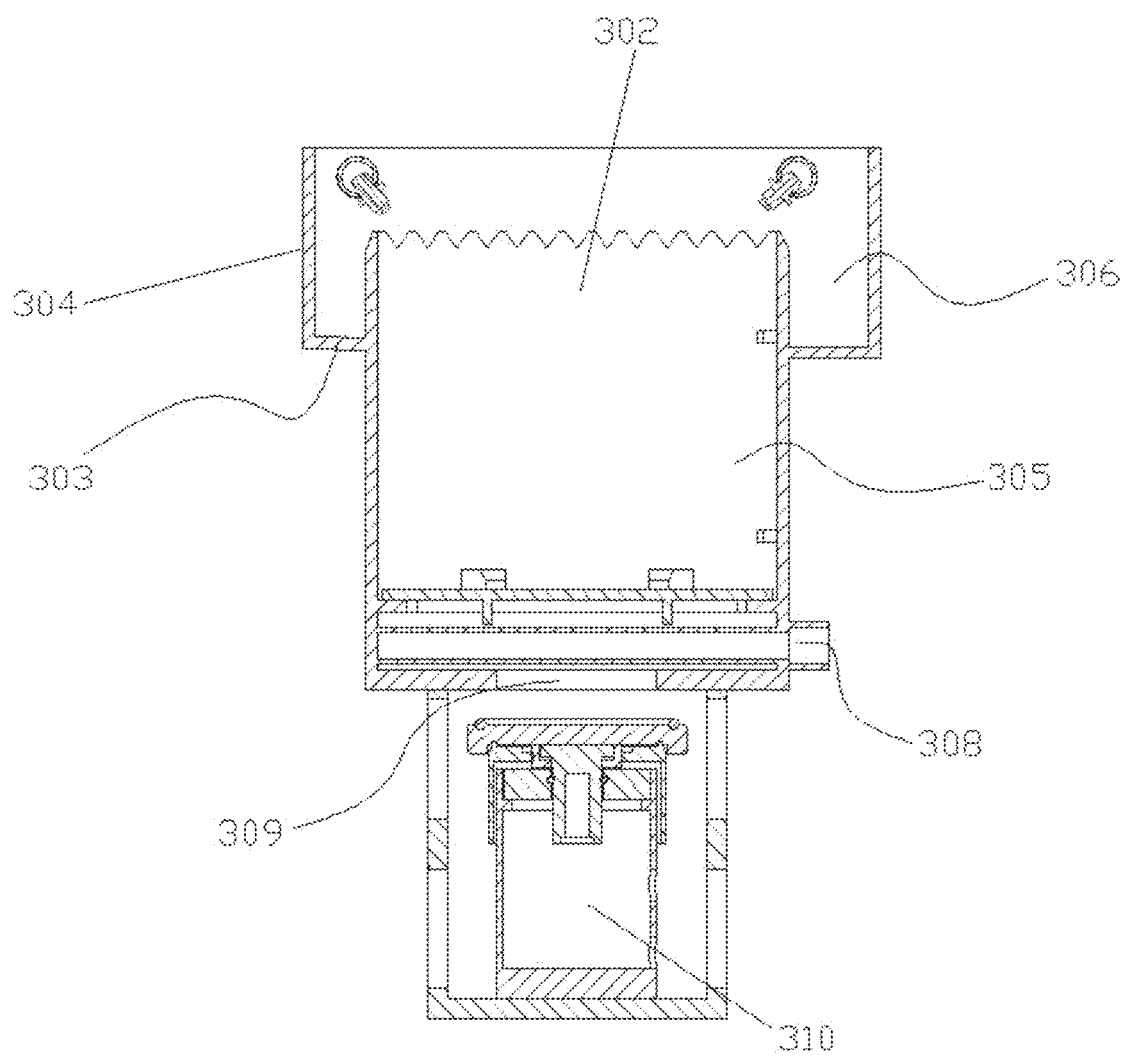
FIG. 12 is a sectional view of a chemical solution tank not designed with a heating device in a research wet etching fully automatic machine according to the present disclosure.

In an embodiment, as shown in FIG. 9 and FIG. 12, the chemical solution tank 301 is provided with a chemical solution chamber 305 and an overflow chamber 306 configured for forming an overflow module.

The chemical solution chamber 305 is configured for accommodating the chemical solution supplied by the chemical solution supply mechanism 32 and for placement of the workpiece 500 therein. The overflow chamber 306 is configured for receiving an overflow of the chemical solution from the chemical solution chamber 305.

The overflow chamber 306 is provided with an overflow recovery port 307. The chemical solution chamber 305 is provided with a chemical solution inlet 308 connected to the pump pipe, and a chemical solution discharge port 309 connected to the chemical solution discharge pipe. The chemical solution discharge valve 310 may be a quick discharge valve. The liquid level sensor for detecting the liquid level is arranged in the chemical solution chamber 305. The liquid level can be automatically controlled by means of the liquid level sensor, thereby saving the chemical solution and protecting the safety of the equipment. Before the cassette 205 holding workpieces 500 of different sizes is placed, different liquid levels may be set according to the size of the workpieces 500 and the size of the cassette 205. Then, the liquid level sensor monitors in real time the liquid level in the chemical solution chamber 305 and feeds back the detected liquid level to the control system 1. The control system 1 controls the amount of chemical solution pumped by the chemical solution pump or controls the opening and closing degree of the chemical solution discharge valve 310 to keep the liquid level within a set range, thereby realizing the accurate and stable control of the liquid level.

In an embodiment, as shown in FIG. 8 to FIG. 11, the chemical solution tank 301 includes an inner tank body 302.

An opening is provided at a top of the inner tank body 302 to form an immersion inlet. An internal space of the inner tank body 302 forms the chemical solution chamber 305. A positioning structure configured for positioning the cassette is arranged at a bottom of the inner tank body 302.

A connecting flange 303 is annularly provided on an outer peripheral surface of the inner tank body 302. A side wall 304 is connected to edges of a top surface of the connecting flange 303. The overflow chamber 306 is defined by the side wall 304, the top surface of the connecting flange 303, and the outer peripheral surface of the inner tank body 302. The inner tank body 302, the connecting flange 303, and the side wall 304 are fixedly connected by welding. Materials of the inner tank body 302, the connecting flange 303, and the side wall 304 are adaptively selected according to the type of chemical solution contained. The structure of the chemical solution tank 301 in the design of the present disclosure is a 1.3 L and 130 mL small-capacity chemical solution tank 301 compatible with a ⅘-inch workpiece 500 and a 1 cm to 2 cm small-size workpiece 500, such that the amount of chemical solution used can be greatly reduced.

In an embodiment, as shown in FIG. 9, the chemical solution supply mechanism 32 further includes a heating device 312 configured for forming the heating module. The heating device 312 is configured for heating the chemical solution in the chemical solution chamber 305 according to the preset chemical solution supply strategy. The heating device 312 may not need to be arranged in each of the chemical solution tanks 301. Whether to equip a chemical solution tank with the heating device 312 may be flexibly determined as required. For example, if chemical solutions in some chemical solution tanks 301 do not need to be heated during the experiment, these chemical solution tanks 301 do not need to be equipped with the heating device 312.

In an embodiment, the heating device 312 may adopt a direct heating design or a water bath heating design. The water bath heating design is safer for flammable and explosive organic chemical solutions. As shown in FIG. 9, the chemical solution tank 301 further includes an outer tank body.

A bottom of the inner tank body 302 extends into the outer tank body, and the connecting flange 303 is connected to the outer tank body, such that a heating chamber 311 is defined by the connecting flange 303, the outer tank body, and the inner tank body 302. A medium input pipe and a medium output pipe which are in communication with the heating chamber 311 are provided on the outer tank body. The heating device 312 is mounted in the heating chamber 311 and is configured for heating a heat conduction medium in the heating chamber 311. The heat conduction medium may be water or a heat conduction oil, which is not limited herein.

The heating device 312 may be an electric heating tube or an electric heating wire, and a temperature sensor may be arranged in the heating chamber 311 for detecting the temperature of the heat conduction medium and feeding back the detected temperature to the control system 1, such that the control system 1 can accurately control the heating temperature of the chemical solution chamber 305 by controlling power of the heating device 312.

In an embodiment, the chemical solution supply mechanism 32 further includes a circulation device configured for forming the circulation filtration module or a circulation spray device configured for forming the spray module. The circulation device is configured for drawing the chemical solution from the chemical solution chamber 305 according to the preset chemical solution supply strategy, filtering the drawn chemical solution, and returning the filtered chemical solution to the chemical solution chamber 305. The circulation spray device is configured for drawing the chemical solution from the chemical solution chamber 305 according to the preset chemical solution supply strategy, filtering the drawn chemical solution, and returning the filtered chemical solution to the chemical solution chamber 305 by spraying.

The circulation device is additionally provided to realize the circulation of the chemical solution, such that the chemical solution in the chemical solution chamber 305 is in a flowing state, and can come into full contact with the workpiece 500, thereby improving the cleaning and etching effects. The circulation device may include a circulating pump, circulating delivery pipes, and a filter device. An input end of the circulating pump is connected to the filter device and connected to one side of the chemical solution chamber 305 through a circulating delivery pipe. An output end of the circulating pump is connected to the other side of the chemical solution chamber 305 through a circulating delivery pipe.

Different from the circulation device, in the circulation spray device, reflux is carried out by spraying. Accordingly, the circulation spray device may include a circulating pump, circulating delivery pipes, a spray head, and a filter device.

Of course, for the spray design, one end of the pump pipe may also be connected to a spray head to realize a spray function, i.e., the chemical solution may be fed by spraying.

In an embodiment, the chemical solution supply mechanism 32 further includes a bubbling device configured for forming the bubbling module. The bubbling device is configured for generating bubbles in the chemical solution in the chemical solution chamber 305 according to the preset chemical solution supply strategy, thus providing a bubbling function in the chemical solution tank 301.

Figure 10:
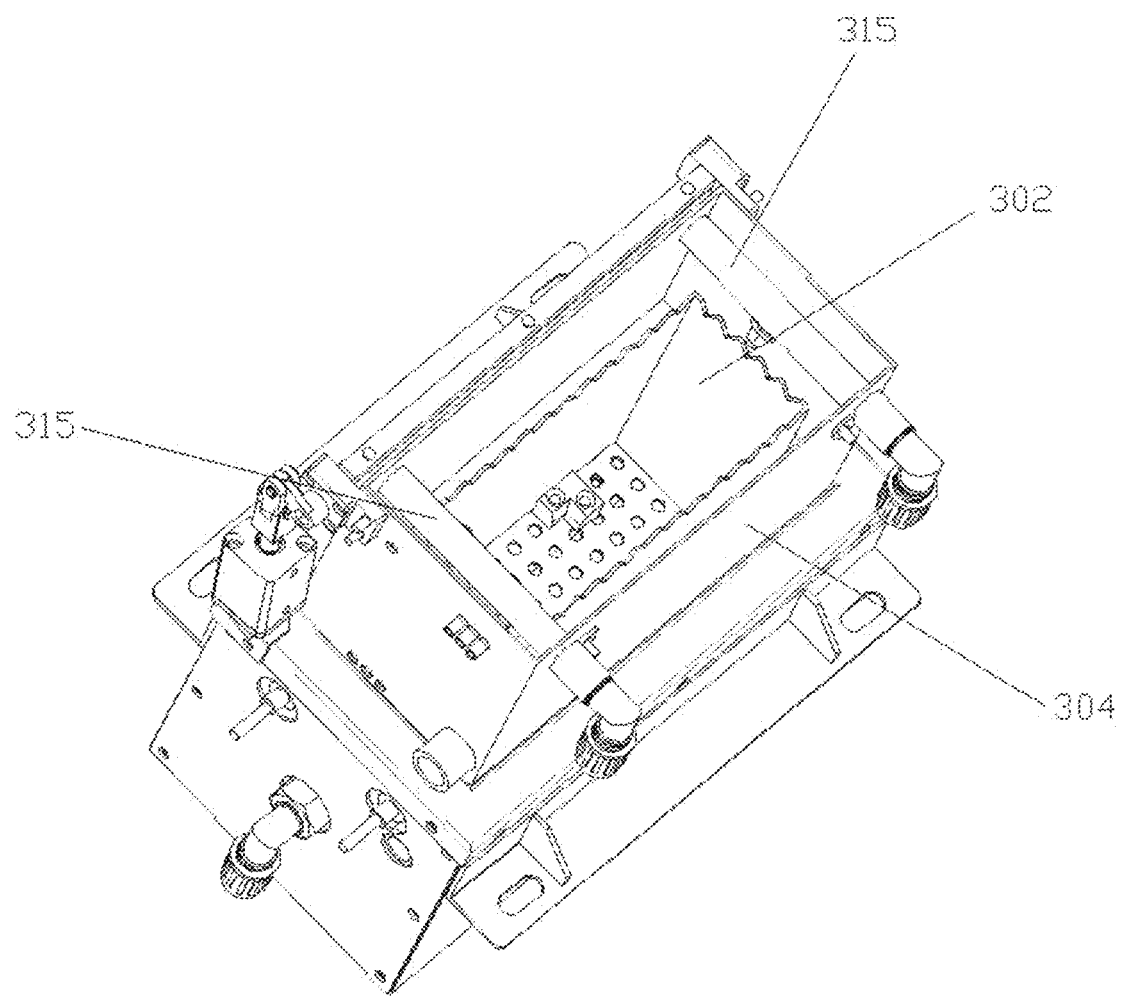
FIG. 10 is a perspective view of a chemical solution tank designed with a heating device and not covered by a tank cover in a research wet etching fully automatic machine according to the present disclosure.
Figure 11:
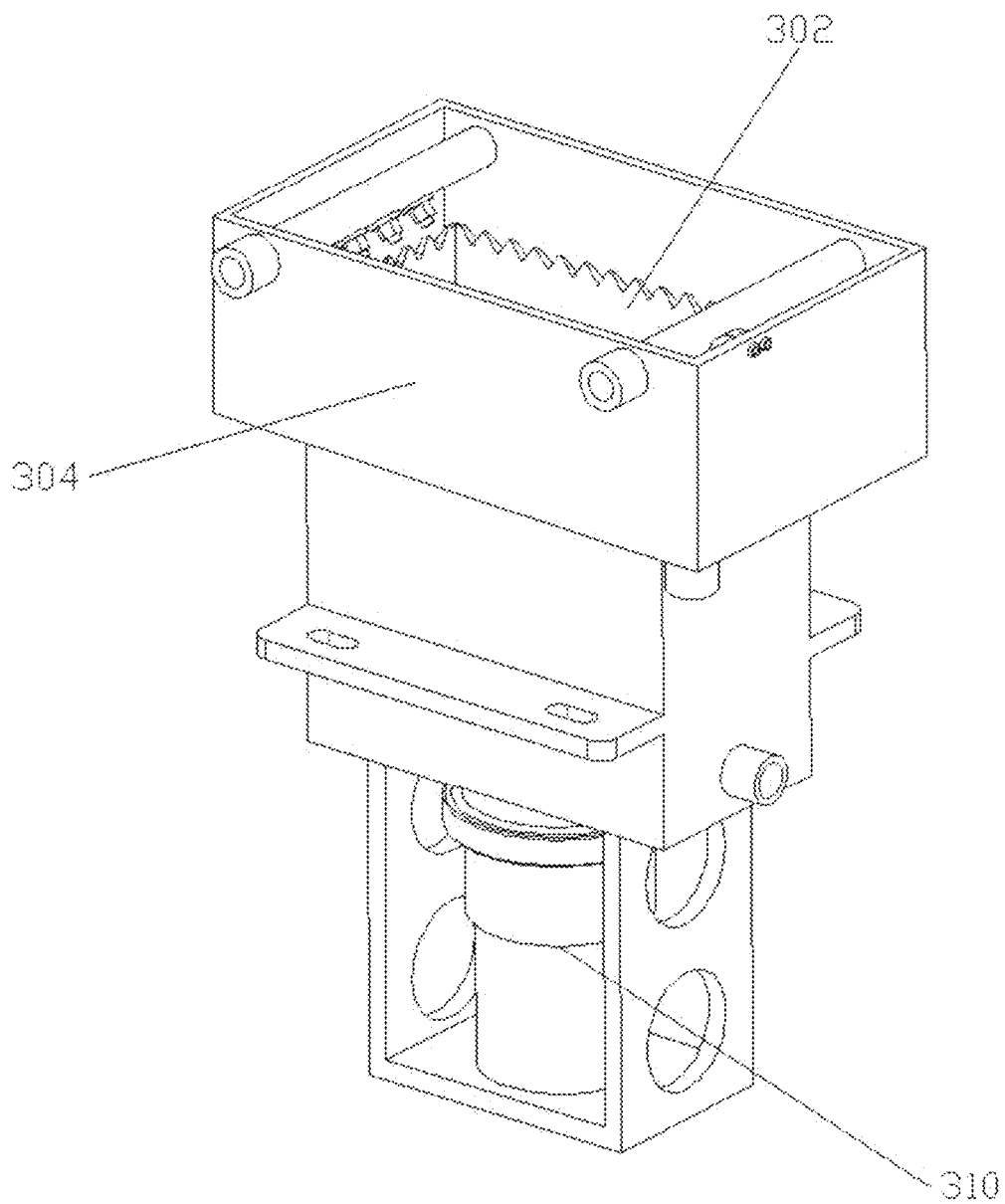
FIG. 11 is a perspective view of a chemical solution tank not designed with a heating device and not covered by a tank cover in a research wet etching fully automatic machine according to the present disclosure.

In an embodiment, the etching system 3 further includes a cleaning device 315. The cleaning device 315 is configured for cleaning the workpiece 500 in the chemical solution chamber 305. Two cleaning devices 315 may be provided, which may each be a spray pipe. As shown in FIG. 10, the two cleaning devices 315 may be symmetrically mounted on the chemical solution tank 301 and arranged facing the chemical solution chamber 305. One of the cleaning devices 315 may be connected to a nitrogen tank through a sprayer, and the other cleaning device 315 may be connected to a pure water tank through a sprayer.

Figure 8:
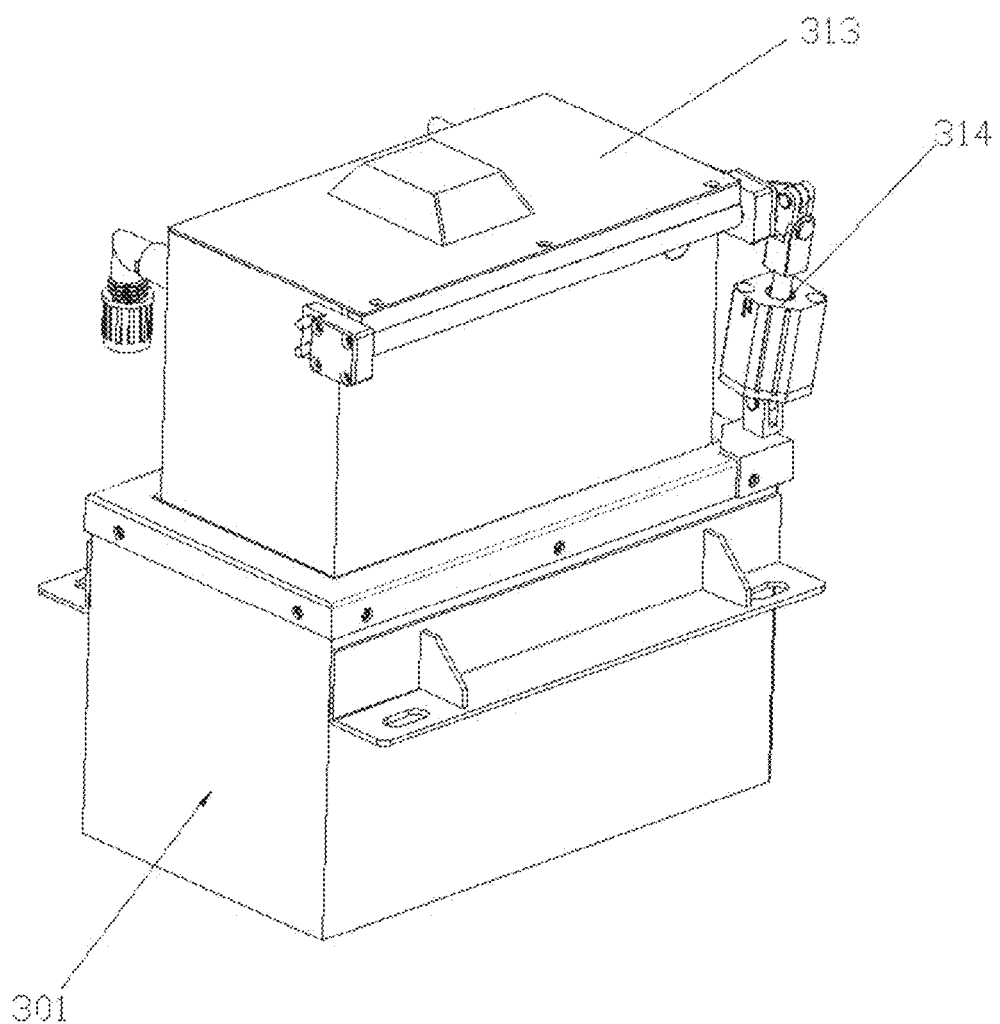
FIG. 8 is a perspective view of a chemical solution tank designed with a heating device in a research wet etching fully automatic machine according to the present disclosure.

In an embodiment, as shown in FIG. 8, the etching system 3 further includes an etching cover device. The etching cover device is configured for controlling opening and closing of the immersion inlet of the chemical solution chamber 305. The etching cover device is designed to include an etching end cover 313 and a cover driver 314. One side of the etching end cover 313 is hingedly connected to one side of the inner tank body 302 through a rotating shaft. The cover driver 314 is mounted on the chemical solution tank 301 and is connected to the rotating shaft to drive the rotating shaft to rotate, so as to control the opening and closing of the etching end cover 313. The design of the etching cover device can improve data accuracy and ensure the safety of operation personnel.

The design of the automatically controlled etching cover device can improve the operation efficiency and reduce direct contact between the operation personnel and harmful substances. In addition, the etching cover device may be interconnected to the control system 1. For example, when the monitoring system 7 detects that there is an abnormality in the equipment, the etching cover device is controlled to close the chemical solution tank 301. The cover driver 314 may be designed as a pneumatic telescopic cylinder, which drives the rotating shaft to rotate through a linkage mechanism. The timing and frequency of automatic opening/closing the etching end cover 313 may be set according to process and safety requirements, thereby improving the reliability, efficiency and safety of scientific research experiments.

In an embodiment, the chemical solution supply mechanism 32 further includes an ultrasonic instrument configured for causing the chemical solution chamber 305 to vibrate according to the preset chemical solution supply strategy.

The functions such as spraying, circulation filtration spraying, heating, circulation filtration, automatic liquid chemical solution formulation, vibration, bubbling, and overflow of the etching system 3 listed in the present disclosure may be configured on the corresponding chemical solution tank 301 according to process requirements.

For example, taking the design of a chemical solution tank 301 for acetone/isopropanol (IPA)/EKC as an example, the functions of spraying, circulation filtration spraying, heating, and circulation filtration may be configured, and the material of the tank structure may be SUS316L. Taking the design of a chemical solution tank 301 for de-ionized water (DIW) as an example, the functions of circulation filtration spraying, bubbling, overflow, and quick discharge may be configured, and the material of the tank structure may be NPP.

The preset chemical solution supply strategy may be a combination of an etching environment strategy and a chemical solution supply strategy.

For example, the chemical solution supply strategy may be a chemical solution supply amount control strategy or a liquid chemical solution formulation control strategy.

The etching environment strategy may be creating an etching environment with circulation filtration spraying and heating at a preset temperature, an etching environment with circulation filtration and bubbling, an etching environment with bubbling and ultrasonic vibration, or an etching environment with chemical solution spraying and bubbling. The implementation of this strategy may be realized by the chemical solution supply mechanism 32 in cooperation with the human-computer interaction system 5, the timing system 6, and the like.

Figure 13:
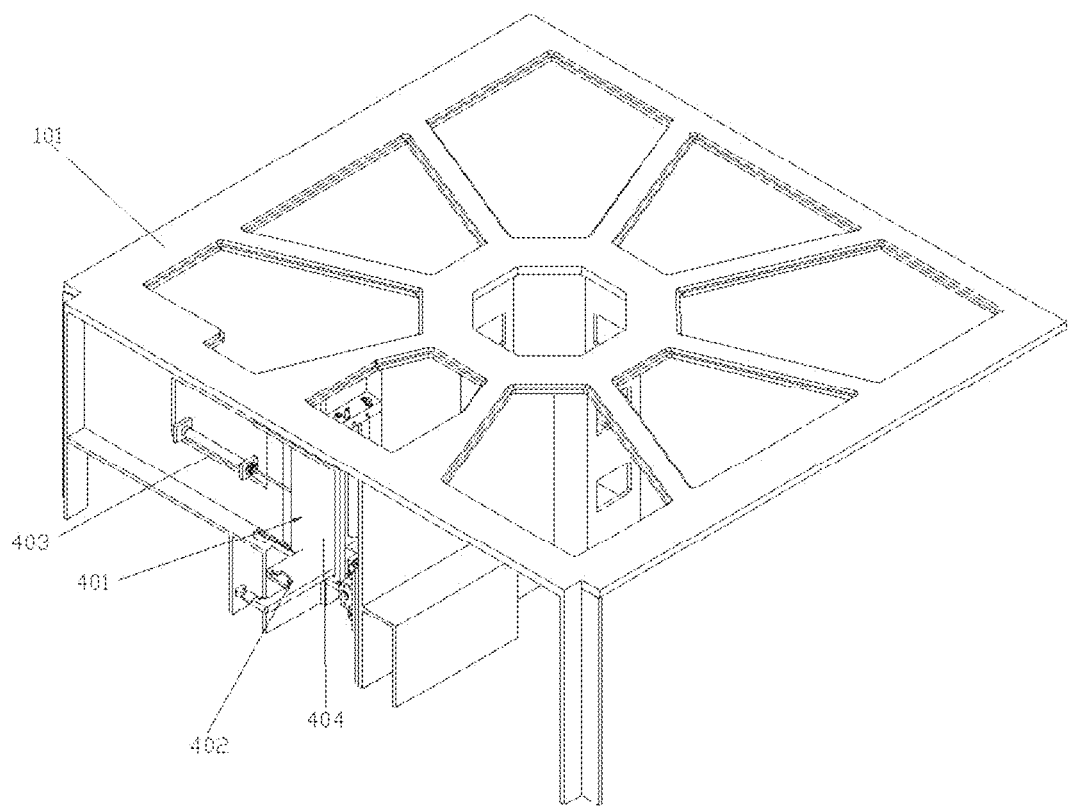
FIG. 13 is a partial schematic structural view of a research wet etching fully automatic machine including a conveying device according to the present disclosure.

In an embodiment, as shown in FIG. 13, the feeding system 4 includes a conveying device 402 and a first feeding cover device 401.

The conveying device 402 is configured for conveying the workpiece 500 from a preparation position outside the machine body 100 to a loading position in the miniaturized machine chamber. As shown in FIG. 1, a loading table 116 is arranged at the preparation position outside the machine body 100. The loading table 116 is configured for placing the workpiece 500 to be experimented or the cassette 205 holding the workpiece 500.

A feeding port in communication with the miniaturized machine chamber and configured for allowing the conveyed workpiece 500 to pass through is provided on the machine body 100. The first feeding cover device 401 is configured for controlling opening and closing of the feeding port. The first feeding cover device 401 includes a baffle plate 404 and a plate driver 403. The baffle plate 404 is slidably mounted on the machine body 100 and is configured for blocking the feeding port. The plate driver 403 may be a telescopic cylinder, and is connected to the baffle plate 404 to drive the baffle plate 404 to telescopically move, so as to realize opening and closing control. Before feeding is carried out, the feeding port is opened. After feeding is completed, the feeding port is closed.

Figure 14:
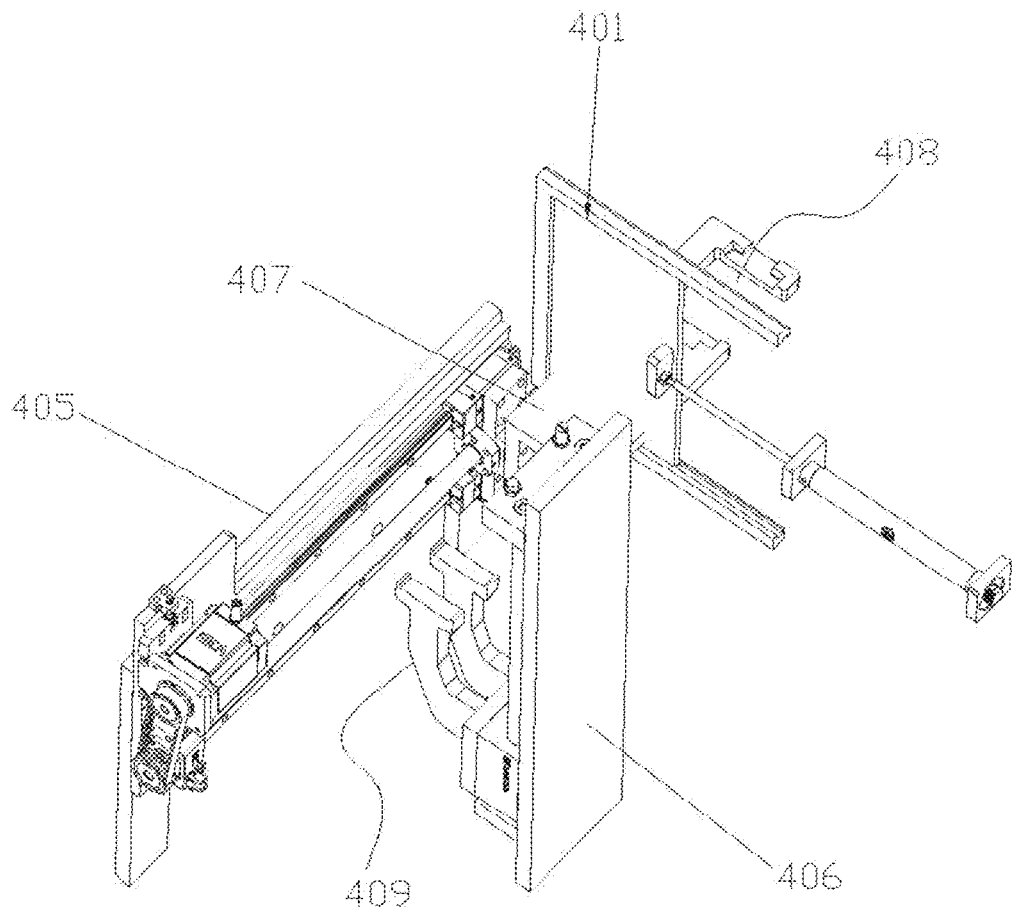
FIG. 14 is a schematic structural view of a conveying device in a research wet etching fully automatic machine according to the present disclosure.

In an embodiment, as shown in FIG. 14, taking the above-mentioned design having the supporting partition plate 101 as an example, the feeding system 4 further includes a second feeding cover device.

The conveying device 402 may be mounted in the lower chamber. To prevent conveying device 402 mounted in the lower chamber from being affected by water leaking through the first drainage holes 103, an independent mounting chamber for mounting the conveying device 402 may be designed in the lower chamber.

The conveying device 402 includes a first feeding mechanism 405 and a second feeding mechanism 406.

The supporting partition plate 101 is provided with a second avoidance port for the workpiece 500 to enter the upper chamber. The second avoidance port is in communication with the mounting chamber.

The first feeding mechanism 405 is configured for conveying the workpiece 500 from the preparation position to a transit position in the lower chamber. The second feeding mechanism 406 is configured for conveying the workpiece 500 from the transit position to the loading position in the upper chamber. The first feeding mechanism 405 may be a horizontal displacement mechanism, and the second feeding mechanism 406 may be a vertical displacement mechanism. A driving end of the first feeding mechanism 405 is connected to a first carrying member 407. The first carrying member 407 is provided with a positioning groove for fixing the cassette 205. An avoidance slot 408 is further provided at the position of the positioning groove. A driving end of the second feeding mechanism 406 is connected to a second carrying member 409. The second carrying member 409 can pass through the avoidance slot 408 to carry the cassette 205 from the first carrying member 407, and continue to convey the cassette 205 to the loading position.

The second feeding cover device is configured for controlling opening and closing of the second avoidance port. For the structural design of the second feeding cover device, reference may be made to the structural design of the first feeding cover device, and the details will not be repeated herein. After the workpiece 500 is conveyed to the loading position and the robot module 21 grips the workpiece 500, the second feeding cover device can be switched to a state in which the second avoidance port is closed.

Again, the beneficial effects of the research wet etching fully automatic machine designed in the present disclosure are summarized as follows.

1. The scientific research efficiency can be improved. The fully automatic design can greatly reduce the experimental time, provide more accurate and stable experimental results, enhance the credibility of scientific research results, speed up scientific research progress, improve the scientific research efficiency, and promote the formation and innovation of scientific knowledge.

2. Scientific research resources can be saved. The fully automatic design can precisely control the amount of chemical solution used, reduce the amount of reagents used, reduce scientific research costs, and improve the resource utilization efficiency. In addition, the fully automatic design can also automatically monitor and adjust experimental conditions, reduce the risk of experimental failure, reduce the waste of experimental consumable materials, and reduce resource waste. In addition, the equipment structure is optimized and a miniaturized design is achieved to adapt to small-size workpiece experiments. As such, not only the occupation of space and the installation and maintenance costs are reduced, but also the consumption of the chemical solutions is greatly reduced, thereby reducing scientific research costs.

3. The safety of personnel and equipment can be ensured. Remote operation is realized through automatic processes and the precise control system 1, to reduce contact between the operation personnel and dangerous chemical solutions, thereby reducing the risk of operation and ensuring the safety of the personnel and equipment.

4. Commercial value and economic benefits are provided. The fully automatic machine has a wide range of applications, fills the gap of existing technologies in the scientific research field for research wet etching equipment/process research, can be used in various laboratories of colleges and university as well as other scientific research institutions to meet scientific research needs, and has a positive and far-reaching influence on the development of research on semiconductors. Moreover, the high degrees of intelligence and automation of the fully automatic machine will attract users' attention and is expected to achieve great success in the market. In addition, the development of the fully automatic machine will also promote the development of related industrial chains and promote the upgrading and innovation of related technologies and equipment, thus providing a huge boost to promoting economic progress.

Although the research wet etching fully automatic system and machine provided by the present disclosure have been described in detail above, those having ordinary skills in the art can make modifications to the specific implementations and application range according to the concept of the embodiments of the present disclosure. In conclusion, the content of this description should not be construed as a limitation on the present disclosure.

What is claimed is:

1. A research wet etching fully automatic machine, comprising a machine body and a research wet etching fully automatic system, wherein:
   the research wet etching fully automatic system is arranged on the machine body and comprises a machine system, an etching system, a feeding system, a robot system, and a control system;
   the machine system is configured for providing a miniaturized machine chamber comprising an installation space and a working space;
   the etching system comprises a plurality of chemical solution modules arranged in an arc pattern in the miniaturized machine chamber;
   each of the chemical solution modules comprises a chemical solution tank and a chemical solution supply mechanism;
   the chemical solution supply mechanism is configured for supplying a chemical solution to the chemical solution tank according to a preset chemical solution supply strategy and controlling an etching environment in the chemical solution tank;
   the feeding system is configured for conveying a workpiece into the working space and closing the working space after the conveying is completed;
   the robot system comprises a robot module and a vision processor communicatively connected to the robot module;
   the robot module is internally arranged at a top of the working space, and is configured for gripping the workpiece according to image information fed back by the vision processor, and placing the workpiece into the chemical solution tank for etching according to a preset etching strategy;
   the control system is communicatively connected to the machine system, the feeding system, the robot system, and the etching system, and is configured for implementing automatic etching operation according to a user instruction;
   the miniaturized machine chamber is arranged in the machine body;
   a supporting partition plate is arranged in the miniaturized machine chamber;
   the miniaturized machine chamber is divided into an upper chamber and a lower chamber by the supporting partition plate;
   the working space is formed in the upper chamber;
   the plurality of chemical solution modules are circumferentially arranged in the lower chamber;
   the supporting partition plate is provided with first avoidance ports respectively in communication with the chemical solution tanks in the chemical solution modules;
   a spray cleaning device is further mounted on the machine body;
   the spray cleaning device comprises a spray assembly and a movable device;
   the movable device is mounted in the upper chamber and connected to the spray assembly, and is configured for driving the spray assembly to move;
   a plurality of first drainage holes are provided on the supporting partition plate; and
   the lower chamber is provided with a main drainage pipe in communication with outside of the machine body.

2. The research wet etching fully automatic machine of claim 1, wherein the robot module is further configured for gripping a cleaning tool according to the image information fed back by the vision processor to execute a cleaning action.

3. The research wet etching fully automatic machine of claim 1, wherein the robot module is further configured for executing at least one of a telescoping operation, a rotation operation, and a shaking operation.

4. The research wet etching fully automatic machine of claim 1, further comprising a timer, wherein
   the timer is configured for acquiring running time information of the machine system, the feeding system, and the robot system and feeding back the running time information to the control system, such that the control system controls the machine system, the feeding system, the robot system, and the etching system according to a preset time strategy.

5. The research wet etching fully automatic machine of claim 1, further comprising a human-computer interaction system and a monitoring system, wherein
   the human-computer interaction system is communicatively connected to the control system;
   the monitoring system is configured for respectively acquiring running data of the machine system, the robot system, the etching system, and the feeding system, and sending out an alarm when the running data exceeds a threshold; and the monitoring system is further configured for monitoring the machine system, the robot system, the etching system, and the feeding system in real time according to a preset monitoring strategy.

6. The research wet etching fully automatic machine of claim 1, wherein the chemical solution supply mechanism comprises a chemical solution supply module and an etching environment module;
   the chemical solution supply module is configured for supplying a chemical solution in a small-capacity chemical solution tank to the chemical solution tank;
   the etching environment module comprises at least one of a heating module, a bubbling module, an ultrasonic vibration module, a cleaner, a spray module, and a circulation filtration module; and
   the chemical solution tank is provided with an overflow recovery module.

7. The research wet etching fully automatic machine of claim 6, wherein the chemical solution supply mechanism comprises a chemical solution supply device configured for forming the chemical solution supply module and a chemical solution discharge device;
   the chemical solution supply device comprises a pump pipe and a chemical solution pump;
   one end of the pump pipe is connected to the chemical solution tank, and the other end of the pump pipe is connected to the small-capacity chemical solution tank;
   the chemical solution pump is mounted on the pump pipe, and is configured for pumping the chemical solution in the small-capacity chemical solution tank into the chemical solution tank according to the preset chemical solution supply strategy;
   the chemical solution discharge device comprises a chemical solution discharge pipe and a chemical solution discharge valve;
   the chemical solution discharge pipe is connected to the chemical solution tank;
   the chemical solution discharge valve is connected to the chemical solution discharge pipe, and is configured for controlling a flow rate in the chemical solution discharge pipe according to the preset chemical solution supply strategy; and
   a liquid level sensor configured for detecting a liquid level of the chemical solution is arranged in the chemical solution tank.

8. The research wet etching fully automatic machine of claim 7, wherein the chemical solution tank is provided with a chemical solution chamber and an overflow chamber configured for forming an overflow module;
   the chemical solution chamber is configured for accommodating the chemical solution supplied by the chemical solution supply mechanism and for placement of the workpiece therein;
   the overflow chamber is configured for receiving an overflow of the chemical solution from the chemical solution chamber; and
   the pump pipe and the chemical solution discharge pipe are connected to the chemical solution chamber.

9. The research wet etching fully automatic machine of claim 8, wherein the chemical solution tank comprises an inner tank body;
   an opening is provided at a top of the inner tank body to form an immersion inlet;
   an internal space of the inner tank body forms the chemical solution chamber;
   a connecting flange is annularly provided on an outer peripheral surface of the inner tank body;
   a side wall is connected to edges of a top surface of the connecting flange; and
   the overflow chamber is defined by the side wall, the top surface of the connecting flange, and the outer peripheral surface of the inner tank body.

10. The research wet etching fully automatic machine of claim 9, wherein the chemical solution supply mechanism further comprises a heating device configured for forming the heating module; and
    the heating device is configured for heating the chemical solution in the chemical solution chamber according to the preset chemical solution supply strategy.

11. The research wet etching fully automatic machine of claim 10, wherein the chemical solution tank further comprises an outer tank body;
    a bottom of the inner tank body extends into the outer tank body, and the connecting flange is connected to the outer tank body, such that a heating chamber is defined by the connecting flange, the outer tank body, and the inner tank body;
    a medium input pipe and a medium output pipe which are in communication with the heating chamber are provided on the outer tank body; and
    the heating device is mounted in the heating chamber and is configured for heating a heat conduction medium in the heating chamber.

12. The research wet etching fully automatic machine of claim 8, wherein the chemical solution supply mechanism further comprises a circulation device configured for forming the circulation filtration module or a circulation spray device configured for forming the spray module;
    the circulation device is configured for drawing the chemical solution from the chemical solution chamber according to the preset chemical solution supply strategy, filtering the drawn chemical solution, and returning the filtered chemical solution to the chemical solution chamber; and
    the circulation spray device is configured for drawing the chemical solution from the chemical solution chamber according to the preset chemical solution supply strategy, filtering the drawn chemical solution, and returning the filtered chemical solution to the chemical solution chamber by spraying.

13. The research wet etching fully automatic machine of claim 8,
    wherein the cleaner is configured for cleaning the workpiece in the chemical solution chamber.

14. The research wet etching fully automatic machine of claim 8, wherein the chemical solution supply mechanism further comprises a bubbling device configured for forming the bubbling module; and
    the bubbling device is configured for generating bubbles in the chemical solution in the chemical solution chamber according to the preset chemical solution supply strategy.

15. The research wet etching fully automatic machine of claim 8, wherein the etching system further comprises an etching cover device; and
    the etching cover device is configured for controlling opening and closing of the immersion inlet of the chemical solution chamber.

16. The research wet etching fully automatic machine of claim 1, wherein the robot module is a collaborative robot.

17. The research wet etching fully automatic machine of claim 1, wherein an electric control chamber and a chemical solution stock chamber configured for storing the small-capacity chemical solution tank are provided in a space below the miniaturized machine chamber in the machine body.

18. The research wet etching fully automatic machine of claim 1, wherein the machine system further comprises a fan filter unit;
the machine body is provided with an air exhaust port and an air supply port in communication with the upper chamber; and
the fan filter unit is mounted on the machine body and connected to the air supply port.

19. The research wet etching fully automatic machine of claim 18, wherein the feeding system comprises a conveying device and a first feeding cover device;
the conveying device is configured for conveying the workpiece from a preparation position outside the machine body to a loading position in the miniaturized machine chamber;
a feeding port in communication with the miniaturized machine chamber and configured for allowing the conveyed workpiece to pass through is provided on the machine body; and
the first feeding cover device is configured for controlling opening and closing of the feeding port.

20. The research wet etching fully automatic machine of claim 19, wherein the feeding system further comprises a second feeding cover device;
the conveying device is mounted in the lower chamber and comprises a first feeding mechanism and a second feeding mechanism;
the supporting partition plate is provided with a second avoidance port for the workpiece to enter the upper chamber;
the first feeding mechanism is configured for conveying the workpiece from the preparation position to a transit position in the lower chamber;
the second feeding mechanism is configured for conveying the workpiece from the transit position to the loading position in the upper chamber; and
the second feeding cover device is configured for controlling opening and closing of the second avoidance port.

21. The research wet etching fully automatic machine of claim 1, wherein a water collecting portion is provided at a middle part of the supporting partition plate; and
a second drainage hole is provided on the water collecting portion.

22. The research wet etching fully automatic machine of claim 21, wherein a support cylinder connected to the supporting partition plate is provided in a middle part of the lower chamber;
a distribution control chamber is provided in the support cylinder;
the second drainage hole is in communication with the distribution control chamber;
a branch drainage pipe connected to the second drainage hole is arranged in the distribution control chamber; and
an end of the branch drainage pipe away from the second drainage hole extends out of the support cylinder.

23. The research wet etching fully automatic machine of claim 1, further comprising a cassette for holding the workpiece; and
a cassette clamping mechanism configured for gripping the cassette is connected at an end of the robot module.

24. The research wet etching fully automatic machine of claim 23, wherein the cassette clamping mechanism comprises a clamping driving assembly and two clamping members;
the clamping driving assembly is connected to the two clamping members and is configured for driving the two clamping members to open and close to grip the cassette; and
an explosion-proof and anti-corrosion protective cover is sleeved over the clamping driving assembly.

25. The research wet etching fully automatic machine of claim 24, wherein the cassette comprises two fixing plates;
the two fixing plates are arranged in parallel and spaced apart, and are fixedly connected to each other by a plurality of connecting rods;
an accommodating cavity for accommodating the workpiece is defined by the connecting rods and the two fixing plates;
a handle block is fixedly connected between tops of the two fixing plates;
a guiding groove is provided on each of two side surfaces of the handle block;
positioning protrusions configured for respectively engaging into the guiding grooves are respectively provided on clamping surfaces of the two clamping members; and
a limiting flange configured for contacting with and pressing against a bottom of the handle block is provided at a bottom of each of the clamping members.

26. The research wet etching fully automatic machine of claim 25, wherein a positioning block is fixed on each of two opposing side surfaces of the two fixing plates; and
a press block configured for pressing against the workpiece is movably mounted between the two positioning blocks.

27. The research wet etching fully automatic machine of claim 24, wherein the cassette comprises a bottom plate and two fixing plates;
the two fixing plates are arranged in parallel and spaced apart at a top of the bottom plate;
a handle block is fixedly connected between tops of the two fixing plates;
a guiding groove is provided on each of two side surfaces of the handle block;
positioning protrusions configured for respectively engaging into the guiding grooves are respectively provided on clamping surfaces of the two clamping members;
a limiting flange configured for contacting with and pressing against a bottom of the handle block is provided at a bottom of each of the clamping members;
a plurality of limiting rods are fixed on the bottom plate and between the two fixing plates; and
an accommodating cavity for accommodating the workpiece is defined by the adjacent limiting rods and the bottom plate.

\* \* \* \* \*